United States Patent
Burak et al.

(10) Patent No.: US 9,048,812 B2
(45) Date of Patent: Jun. 2, 2015

(54) BULK ACOUSTIC WAVE RESONATOR COMPRISING BRIDGE FORMED WITHIN PIEZOELECTRIC LAYER

(75) Inventors: Dariusz Burak, Fort Collins, CO (US); Phil Nikkel, Loveland, CO (US); Jyrki Kaitila, Riemerling (DE); John D. Larson, III, Palo Alto, CA (US); Alexandre Shirakawa, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 635 days.

(21) Appl. No.: 13/208,909

(22) Filed: Aug. 12, 2011

(65) Prior Publication Data

US 2012/0218060 A1 Aug. 30, 2012

Related U.S. Application Data

(63) Continuation-in-part of application No. 13/151,631, filed on Jun. 2, 2011, which is a continuation-in-part of application No. 13/074,262, filed on Mar. 29, 2011, which is a continuation-in-part of application No. 13/036,489, filed on Feb. 28, 2011.

(51) Int. Cl.
*H03H 9/54* (2006.01)
*H03H 9/13* (2006.01)
*H03H 9/02* (2006.01)
(Continued)

(52) U.S. Cl.
CPC .......... *H03H 9/132* (2013.01); *H03H 9/02118* (2013.01); *H03H 3/04* (2013.01); *H03H 9/02007* (2013.01); *H03H 9/173* (2013.01); *H03H 9/175* (2013.01); *H03H 9/584* (2013.01);
(Continued)

(58) Field of Classification Search
CPC .......... H03H 9/02086; H03H 9/02118; H03H 9/171–9/178; H03H 9/54; H03H 9/583–9/589
USPC ............. 333/187–192; 310/320, 322, 323.01, 310/334, 335
See application file for complete search history.

(56) References Cited

U.S. PATENT DOCUMENTS 3,174,122 A 3/1965 Fowler et al.
3,189,851 A 6/1965 Fowler
(Continued)

FOREIGN PATENT DOCUMENTS

DE 10160617 6/2003
EP 231892 8/1987
(Continued)

OTHER PUBLICATIONS

Definitions of "within" from "Collins English Dictionary-Complete and Unabridged", Harper Collins publishers copyright 1991, 1994, 1998, 2000, 2003 and "Random House Kernerman Webster's College Dictionary", 2010 K Dictionaries Ltd. copyright 2005, 1997, 1991 by Random House, Inc., as found online at www.thefreedictionary.com, one page.*
(Continued)

*Primary Examiner* — Barbara Summons

(57) ABSTRACT

A bulk acoustic wave (BAW) structure includes a first electrode disposed over a substrate, a piezoelectric layer disposed over the first electrode, and a second electrode disposed over the first piezoelectric layer. A bridge is formed within the piezoelectric layer, where the bridge is surrounded by piezoelectric material of the piezoelectric layer.

20 Claims, 10 Drawing Sheets

(51) Int. Cl.
  *H03H 3/04* (2006.01)
  *H03H 9/17* (2006.01)
  *H03H 9/58* (2006.01)

(52) U.S. Cl.
  CPC .............. *H03H 9/585* (2013.01); *H03H 9/587* (2013.01); *H03H 9/589* (2013.01)

(56) References Cited

U.S. PATENT DOCUMENTS

| | | |
|---|---|---|
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,903,087 A | 5/1999 | Mattson et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |

(56) References Cited

U.S. PATENT DOCUMENTS

| | | | |
|---|---|---|---|
| 6,507,983 | B1 | 1/2003 | Ruby et al. |
| 6,515,558 | B1 | 2/2003 | Ylilammi |
| 6,518,860 | B2 | 2/2003 | Ella et al. |
| 6,525,996 | B1 | 2/2003 | Miyazawa |
| 6,528,344 | B2 | 3/2003 | Kang |
| 6,530,515 | B1 | 3/2003 | Glenn et al. |
| 6,534,900 | B2 | 3/2003 | Aigner et al. |
| 6,542,055 | B1 | 4/2003 | Frank et al. |
| 6,548,942 | B1 | 4/2003 | Panasik |
| 6,548,943 | B2 | 4/2003 | Kaitila et al. |
| 6,549,394 | B1 | 4/2003 | Williams |
| 6,550,664 | B2 | 4/2003 | Bradley et al. |
| 6,559,487 | B1 | 5/2003 | Kang et al. |
| 6,559,530 | B2 | 5/2003 | Hinzel et al. |
| 6,564,448 | B1 | 5/2003 | Oura et al. |
| 6,566,956 | B2 | 5/2003 | Ohnishi et al. |
| 6,566,979 | B2 | 5/2003 | Larson, III et al. |
| 6,580,159 | B1 | 6/2003 | Fusaro et al. |
| 6,583,374 | B2 | 6/2003 | Knieser et al. |
| 6,583,688 | B2 | 6/2003 | Klee et al. |
| 6,593,870 | B2 | 7/2003 | Dummermuth et al. |
| 6,594,165 | B2 | 7/2003 | Duerbaum et al. |
| 6,600,390 | B2 | 7/2003 | Frank |
| 6,601,276 | B2 | 8/2003 | Barber |
| 6,603,182 | B1 | 8/2003 | Low et al. |
| 6,617,249 | B2 | 9/2003 | Ruby et al. |
| 6,617,750 | B2 | 9/2003 | Dummermuth et al. |
| 6,617,751 | B2 | 9/2003 | Sunwoo et al. |
| 6,621,137 | B1 | 9/2003 | Ma et al. |
| 6,630,753 | B2 | 10/2003 | Malik et al. |
| 6,635,509 | B1 | 10/2003 | Ouellet |
| 6,639,872 | B1 | 10/2003 | Rein |
| 6,651,488 | B2 | 11/2003 | Larson, III et al. |
| 6,657,363 | B1 | 12/2003 | Aigner |
| 6,668,618 | B2 | 12/2003 | Larson, III et al. |
| 6,670,866 | B2 | 12/2003 | Ella et al. |
| 6,677,929 | B2 | 1/2004 | Gordon et al. |
| 6,693,500 | B2 | 2/2004 | Yang et al. |
| 6,710,508 | B2 | 3/2004 | Ruby et al. |
| 6,710,681 | B2 | 3/2004 | Figueredo et al. |
| 6,713,314 | B2 | 3/2004 | Wong et al. |
| 6,714,102 | B2 | 3/2004 | Ruby et al. |
| 6,720,844 | B1 | 4/2004 | Lakin |
| 6,720,846 | B2 | 4/2004 | Iwashita et al. |
| 6,724,266 | B2 | 4/2004 | Plazza et al. |
| 6,738,267 | B1 | 5/2004 | Navas Sabater et al. |
| 6,774,746 | B2 | 8/2004 | Whatmore et al. |
| 6,777,263 | B1 | 8/2004 | Gan et al. |
| 6,787,048 | B2 | 9/2004 | Bradley et al. |
| 6,788,170 | B1 | 9/2004 | Kaitila et al. |
| 6,803,835 | B2 | 10/2004 | Frank |
| 6,812,619 | B1 | 11/2004 | Kaitila et al. |
| 6,820,469 | B1 | 11/2004 | Adkins et al. |
| 6,828,713 | B2 | 12/2004 | Bradley et al. |
| 6,842,088 | B2 | 1/2005 | Yamada et al. |
| 6,842,089 | B2 | 1/2005 | Lee |
| 6,849,475 | B2 | 2/2005 | Kim |
| 6,853,534 | B2 | 2/2005 | Williams |
| 6,861,920 | B2 | 3/2005 | Ishikawa et al. |
| 6,872,931 | B2 | 3/2005 | Liess et al. |
| 6,873,065 | B2 | 3/2005 | Haigh et al. |
| 6,873,529 | B2 | 3/2005 | Ikuta et al. |
| 6,874,211 | B2 | 4/2005 | Bradley et al. |
| 6,874,212 | B2 | 4/2005 | Larson, III |
| 6,888,424 | B2 | 5/2005 | Takeuchi et al. |
| 6,900,705 | B2 | 5/2005 | Nakamura et al. |
| 6,903,452 | B2 | 6/2005 | Ma et al. |
| 6,906,451 | B2 | 6/2005 | Yamada et al. |
| 6,911,708 | B2 | 6/2005 | Park |
| 6,917,261 | B2 | 7/2005 | Unterberger |
| 6,924,583 | B2 | 8/2005 | Lin et al. |
| 6,924,717 | B2 | 8/2005 | Ginsburg et al. |
| 6,927,651 | B2 | 8/2005 | Larson, III et al. |
| 6,936,837 | B2 | 8/2005 | Yamada et al. |
| 6,936,928 | B2 | 8/2005 | Hedler et al. |
| 6,936,954 | B2 | 8/2005 | Peczalski |
| 6,941,036 | B2 | 9/2005 | Lucero |
| 6,943,647 | B2 | 9/2005 | Aigner et al. |
| 6,943,648 | B2 | 9/2005 | Maiz et al. |
| 6,946,928 | B2 | 9/2005 | Larson, III et al. |
| 6,954,121 | B2 | 10/2005 | Bradley et al. |
| 6,963,257 | B2 | 11/2005 | Ella et al. |
| 6,970,365 | B2 | 11/2005 | Turchi |
| 6,975,183 | B2 | 12/2005 | Aigner et al. |
| 6,977,563 | B2 | 12/2005 | Komuro et al. |
| 6,985,051 | B2 | 1/2006 | Nguyen et al. |
| 6,985,052 | B2 | 1/2006 | Tikka |
| 6,987,433 | B2 | 1/2006 | Larson, III et al. |
| 6,989,723 | B2 | 1/2006 | Komuro et al. |
| 6,998,940 | B2 | 2/2006 | Metzger |
| 7,002,437 | B2 | 2/2006 | Takeuchi et al. |
| 7,019,604 | B2 | 3/2006 | Gotoh et al. |
| 7,019,605 | B2 | 3/2006 | Larson, III |
| 7,026,876 | B1 | 4/2006 | Esfandiari et al. |
| 7,053,456 | B2 | 5/2006 | Matsuo |
| 7,057,476 | B2 | 6/2006 | Hwu |
| 7,057,478 | B2 | 6/2006 | Korden et al. |
| 7,064,606 | B2 | 6/2006 | Louis |
| 7,084,553 | B2 | 8/2006 | Ludwiczak |
| 7,091,649 | B2 | 8/2006 | Larson, III et al. |
| 7,098,758 | B2 | 8/2006 | Wang et al. |
| 7,102,460 | B2 | 9/2006 | Schmidhammer et al. |
| 7,109,826 | B2 | 9/2006 | Ginsburg et al. |
| 7,128,941 | B2 | 10/2006 | Lee |
| 7,129,806 | B2 | 10/2006 | Sato |
| 7,138,889 | B2 | 11/2006 | Lakin |
| 7,148,466 | B2 | 12/2006 | Eckman et al. |
| 7,158,659 | B2 | 1/2007 | Baharav et al. |
| 7,161,448 | B2 | 1/2007 | Feng et al. |
| 7,170,215 | B2 | 1/2007 | Namba et al. |
| 7,173,504 | B2 | 2/2007 | Larson, III et al. |
| 7,179,392 | B2 | 2/2007 | Robert et al. |
| 7,187,254 | B2 | 3/2007 | Su et al. |
| 7,199,683 | B2 * | 4/2007 | Thalhammer et al. ........ 333/187 |
| 7,209,374 | B2 | 4/2007 | Noro |
| 7,212,083 | B2 | 5/2007 | Inoue et al. |
| 7,212,085 | B2 | 5/2007 | Wu |
| 7,230,509 | B2 | 6/2007 | Stoemmer |
| 7,230,511 | B2 | 6/2007 | Onishi et al. |
| 7,233,218 | B2 | 6/2007 | Park et al. |
| 7,242,270 | B2 | 7/2007 | Larson, III et al. |
| 7,259,498 | B2 | 8/2007 | Nakatsuka et al. |
| 7,268,647 | B2 | 9/2007 | Sano et al. |
| 7,275,292 | B2 | 10/2007 | Ruby et al. |
| 7,276,994 | B2 | 10/2007 | Takeuchi et al. |
| 7,280,007 | B2 | 10/2007 | Feng et al. |
| 7,281,304 | B2 | 10/2007 | Kim et al. |
| 7,294,919 | B2 | 11/2007 | Bai |
| 7,301,258 | B2 | 11/2007 | Tanaka |
| 7,310,861 | B2 | 12/2007 | Aigner et al. |
| 7,313,255 | B2 | 12/2007 | Machida et al. |
| 7,332,985 | B2 | 2/2008 | Larson, III et al. |
| 7,345,410 | B2 | 3/2008 | Grannen et al. |
| 7,358,831 | B2 | 4/2008 | Larson et al. |
| 7,367,095 | B2 | 5/2008 | Larson, III et al. |
| 7,368,857 | B2 | 5/2008 | Tanaka |
| 7,369,013 | B2 | 5/2008 | Fazzio et al. |
| 7,388,318 | B2 | 6/2008 | Yamada et al. |
| 7,388,454 | B2 | 6/2008 | Ruby et al. |
| 7,388,455 | B2 | 6/2008 | Larson, III et al. |
| 7,391,286 | B2 | 6/2008 | Jamneala et al. |
| 7,400,217 | B2 | 7/2008 | Larson, III et al. |
| 7,408,428 | B2 | 8/2008 | Larson, III |
| 7,414,349 | B2 | 8/2008 | Sasaki |
| 7,414,495 | B2 | 8/2008 | Iwasaki et al. |
| 7,423,503 | B2 | 9/2008 | Larson, III et al. |
| 7,425,787 | B2 | 9/2008 | Larson, III |
| 7,439,824 | B2 | 10/2008 | Aigner |
| 7,463,118 | B2 | 12/2008 | Jacobsen |
| 7,466,213 | B2 | 12/2008 | Lobl et al. |
| 7,468,608 | B2 | 12/2008 | Feucht et al. |
| 7,482,737 | B2 | 1/2009 | Yamada et al. |
| 7,508,286 | B2 | 3/2009 | Ruby et al. |
| 7,535,154 | B2 | 5/2009 | Umeda et al. |

(56) References Cited

U.S. PATENT DOCUMENTS

| | | | |
|---|---|---|---|
| 7,535,324 B2 | 5/2009 | Fattinger et al. | |
| 7,545,532 B2 | 6/2009 | Muramoto | |
| 7,561,009 B2 | 7/2009 | Larson, III et al. | |
| 7,576,471 B1 | 8/2009 | Solal | |
| 7,602,101 B2 | 10/2009 | Hara et al. | |
| 7,616,079 B2 | 11/2009 | Tikka et al. | |
| 7,619,493 B2 | 11/2009 | Uno et al. | |
| 7,629,865 B2 | 12/2009 | Ruby | |
| 7,649,304 B2 | 1/2010 | Umeda et al. | |
| 7,684,109 B2 | 3/2010 | Godshalk et al. | |
| 7,758,979 B2 | 7/2010 | Akiyama | |
| 7,768,364 B2 | 8/2010 | Hart et al. | |
| 7,795,781 B2 | 9/2010 | Barber et al. | |
| 7,869,187 B2 | 1/2011 | McKinzie et al. | |
| 7,889,024 B2 | 2/2011 | Bradley et al. | |
| 7,966,722 B2 | 6/2011 | Hart et al. | |
| 7,978,025 B2 | 7/2011 | Yokoyama et al. | |
| 8,384,497 B2 * | 2/2013 | Zhang | 333/187 |
| 8,456,257 B1 * | 6/2013 | Fattinger | 333/187 |
| 8,575,820 B2 | 11/2013 | Shirakawa et al. | |
| 2001/0045793 A1 | 11/2001 | Misu et al. | |
| 2002/0000646 A1 | 1/2002 | Gooch et al. | |
| 2002/0030424 A1 | 3/2002 | Iwata | |
| 2002/0063497 A1 | 5/2002 | Panasik | |
| 2002/0070463 A1 | 6/2002 | Chang et al. | |
| 2002/0121944 A1 | 9/2002 | Larson, III et al. | |
| 2002/0121945 A1 | 9/2002 | Ruby et al. | |
| 2002/0126517 A1 | 9/2002 | Matsukawa et al. | |
| 2002/0140520 A1 | 10/2002 | Hikita et al. | |
| 2002/0152803 A1 | 10/2002 | Larson, III et al. | |
| 2002/0190814 A1 | 12/2002 | Yamada et al. | |
| 2003/0001251 A1 | 1/2003 | Cheever et al. | |
| 2003/0006502 A1 | 1/2003 | Karpman | |
| 2003/0011285 A1 | 1/2003 | Ossmann | |
| 2003/0011446 A1 | 1/2003 | Bradley | |
| 2003/0051550 A1 | 3/2003 | Nguyen et al. | |
| 2003/0087469 A1 | 5/2003 | Ma | |
| 2003/0102776 A1 | 6/2003 | Takeda et al. | |
| 2003/0111439 A1 | 6/2003 | Fetter et al. | |
| 2003/0128081 A1 | 7/2003 | Ella et al. | |
| 2003/0132493 A1 | 7/2003 | Kang et al. | |
| 2003/0132809 A1 | 7/2003 | Senthilkumar et al. | |
| 2003/0141946 A1 | 7/2003 | Ruby et al. | |
| 2003/0179053 A1 | 9/2003 | Aigner et al. | |
| 2003/0205948 A1 | 11/2003 | Lin et al. | |
| 2003/0227357 A1 | 12/2003 | Metzger et al. | |
| 2004/0016995 A1 | 1/2004 | Kuo et al. | |
| 2004/0017130 A1 | 1/2004 | Wang et al. | |
| 2004/0027216 A1 | 2/2004 | Ma et al. | |
| 2004/0056735 A1 | 3/2004 | Nomura et al. | |
| 2004/0092234 A1 | 5/2004 | Pohjonen | |
| 2004/0099898 A1 | 5/2004 | Grivna et al. | |
| 2004/0124952 A1 | 7/2004 | Tikka | |
| 2004/0129079 A1 | 7/2004 | Kato et al. | |
| 2004/0150293 A1 | 8/2004 | Unterberger | |
| 2004/0150296 A1 | 8/2004 | Park et al. | |
| 2004/0166603 A1 | 8/2004 | Carley | |
| 2004/0195937 A1 | 10/2004 | Matsubara et al. | |
| 2004/0212458 A1 | 10/2004 | Lee | |
| 2004/0257171 A1 | 12/2004 | Park et al. | |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0012716 A1 | 1/2005 | Mikulin et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1 | 3/2005 | Nakatsuka et al. | |
| 2005/0057324 A1 | 3/2005 | Onishi et al. | |
| 2005/0068124 A1 | 3/2005 | Stoemmer | |
| 2005/0093396 A1 | 5/2005 | Larson, III et al. | |
| 2005/0093397 A1 | 5/2005 | Yamada et al. | |
| 2005/0093653 A1 | 5/2005 | Larson, III | |
| 2005/0093654 A1 | 5/2005 | Larson, III et al. | |
| 2005/0093655 A1 | 5/2005 | Larson, III et al. | |
| 2005/0093657 A1 | 5/2005 | Larson, III et al. | |
| 2005/0093658 A1 | 5/2005 | Larson, III et al. | |
| 2005/0093659 A1 | 5/2005 | Larson, III et al. | |
| 2005/0104690 A1 | 5/2005 | Larson, III et al. | |
| 2005/0110598 A1 | 5/2005 | Larson, III | |
| 2005/0128030 A1 | 6/2005 | Larson, III et al. | |
| 2005/0140466 A1 | 6/2005 | Larson, III et al. | |
| 2005/0167795 A1 | 8/2005 | Higashi | |
| 2005/0193507 A1 | 9/2005 | Ludwiczak | |
| 2005/0206271 A1 | 9/2005 | Higuchi et al. | |
| 2005/0206479 A1 | 9/2005 | Nguyen et al. | |
| 2005/0206483 A1 | 9/2005 | Pashby et al. | |
| 2005/0218488 A1 | 10/2005 | Matsuo | |
| 2005/0248232 A1 | 11/2005 | Itaya et al. | |
| 2005/0269904 A1 | 12/2005 | Oka | |
| 2005/0275486 A1 | 12/2005 | Feng | |
| 2006/0017352 A1 | 1/2006 | Tanielian | |
| 2006/0071736 A1 | 4/2006 | Ruby et al. | |
| 2006/0081048 A1 | 4/2006 | Mikado et al. | |
| 2006/0087199 A1 | 4/2006 | Larson, III et al. | |
| 2006/0103492 A1 | 5/2006 | Feng et al. | |
| 2006/0114541 A1 | 6/2006 | Van Beek | |
| 2006/0119453 A1 | 6/2006 | Fattinger et al. | |
| 2006/0125489 A1 | 6/2006 | Feucht et al. | |
| 2006/0132262 A1 | 6/2006 | Fazzio et al. | |
| 2006/0164183 A1 | 7/2006 | Tikka et al. | |
| 2006/0176126 A1 | 8/2006 | Wang et al. | |
| 2006/0185139 A1 | 8/2006 | Larson, III et al. | |
| 2006/0197411 A1 | 9/2006 | Hoen et al. | |
| 2006/0238070 A1 | 10/2006 | Costa et al. | |
| 2006/0284706 A1 | 12/2006 | Ginsburg et al. | |
| 2006/0284707 A1 | 12/2006 | Larson, III et al. | |
| 2006/0290446 A1 | 12/2006 | Aigner et al. | |
| 2007/0035364 A1 | 2/2007 | Sridhar et al. | |
| 2007/0037311 A1 | 2/2007 | Izumi et al. | |
| 2007/0080759 A1 | 4/2007 | Jamneala et al. | |
| 2007/0085447 A1 | 4/2007 | Larson, III | |
| 2007/0085631 A1 | 4/2007 | Larson, III et al. | |
| 2007/0085632 A1 | 4/2007 | Larson, III et al. | |
| 2007/0086080 A1 | 4/2007 | Larson, III et al. | |
| 2007/0086274 A1 | 4/2007 | Nishimura et al. | |
| 2007/0090892 A1 | 4/2007 | Larson, III | |
| 2007/0170815 A1 | 7/2007 | Unkrich | |
| 2007/0171002 A1 | 7/2007 | Unkrich | |
| 2007/0176710 A1 | 8/2007 | Jamneala et al. | |
| 2007/0205850 A1 | 9/2007 | Jamneala et al. | |
| 2007/0279153 A1 | 12/2007 | Ruby | |
| 2007/0291164 A1 | 12/2007 | Goh et al. | |
| 2008/0055020 A1 | 3/2008 | Handtmann et al. | |
| 2008/0129414 A1 | 6/2008 | Lobl et al. | |
| 2008/0143215 A1 | 6/2008 | Hara et al. | |
| 2008/0258842 A1 | 10/2008 | Ruby et al. | |
| 2008/0297278 A1 | 12/2008 | Handtmann et al. | |
| 2008/0297279 A1 | 12/2008 | Thalhammer et al. | |
| 2008/0297280 A1 | 12/2008 | Thalhammer et al. | |
| 2009/0001848 A1 | 1/2009 | Umeda et al. | |
| 2009/0079302 A1 | 3/2009 | Wall et al. | |
| 2009/0096550 A1 | 4/2009 | Handtmann et al. | |
| 2009/0102319 A1 | 4/2009 | Nakatsuka et al. | |
| 2009/0127978 A1 | 5/2009 | Asai et al. | |
| 2009/0153268 A1 | 6/2009 | Milsom et al. | |
| 2009/0201594 A1 | 8/2009 | Smith | |
| 2009/0267457 A1 | 10/2009 | Barber et al. | |
| 2010/0033063 A1 | 2/2010 | Nishihara et al. | |
| 2010/0039000 A1 * | 2/2010 | Milson et al. | 310/366 |
| 2010/0052815 A1 | 3/2010 | Bradley et al. | |
| 2010/0091370 A1 | 4/2010 | Mahrt et al. | |
| 2010/0107389 A1 | 5/2010 | Nessler et al. | |
| 2010/0148637 A1 | 6/2010 | Satou | |
| 2010/0176899 A1 | 7/2010 | Schaufele et al. | |
| 2010/0187948 A1 | 7/2010 | Sinha et al. | |
| 2010/0260453 A1 | 10/2010 | Block | |
| 2010/0327697 A1 | 12/2010 | Choy et al. | |
| 2010/0327994 A1 | 12/2010 | Choy et al. | |
| 2011/0084779 A1 | 4/2011 | Zhang | |
| 2011/0121916 A1 | 5/2011 | Barber et al. | |
| 2011/0148547 A1 * | 6/2011 | Zhang | 333/187 |
| 2012/0161902 A1 | 6/2012 | Feng et al. | |
| 2012/0194297 A1 | 8/2012 | Choy | |

(56) References Cited

U.S. PATENT DOCUMENTS

| | | |
|---|---|---|
| 2012/0218055 A1 | 8/2012 | Burak et al. |
| 2012/0218058 A1 | 8/2012 | Burak et al. |
| 2012/0218059 A1 | 8/2012 | Burak et al. |
| 2012/0280767 A1 | 11/2012 | Burak et al. |
| 2013/0038408 A1 | 2/2013 | Burak et al. |

FOREIGN PATENT DOCUMENTS

| | | |
|---|---|---|
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-232334 | 8/2000 |
| JP | 2001-102901 | 4/2001 |
| JP | 2001-508630 | 6/2001 |
| JP | 2002/217676 | 8/2002 |
| JP | 2003017964 | 1/2003 |
| JP | 2003/124779 | 4/2003 |
| JP | 2006-109472 | 4/2006 |
| JP | 2006-295924 | 10/2006 |
| JP | 2007-006501 | 1/2007 |
| JP | 2007/028669 | 2/2007 |
| JP | 2007-208845 | 8/2007 |
| JP | 2007-295306 | 11/2007 |
| JP | 2008-131194 | 6/2008 |
| JP | 2008-211394 | 9/2008 |
| WO | WO-98/16957 | 4/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

"Co-pending U.S. Appl. No. 13/036,489, filed Feb. 28, 2011".
"Co-pending U.S. Appl. No. 13/074,262, filed Mar. 29, 2011".
"Co-pending U.S. Appl. No. 13/101,376, filed May 5, 2011".
Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009 , 1731-1744.
Pensala, , "Thin film bulk acoustic wave devices: performance optimization and modeling", http://www.vtt.fi/inf/pdf/publications/2011/P756.pdf, Dissertation presented Feb. 25, 2011, Espoo Finland, 108 pages.
Co-pending U.S. Appl. No. 12/710,640, filed Feb. 23, 2010.
Co-pending U.S. Appl. No. 13/074,094, filed Mar. 29, 2011.
Linnell Martinez, "High confinement suspended micro-ring resonators in silicon-on-insulator," Optics Express, Jun. 26, 2006, vol. 14, No. 13, pp. 6259-6263.
U.S. Appl. No. 10/971,169, filed Oct. 22, 2004, Larson III, John D., et al.
Akiyama, et al., "Enhancement of Piezoelectric Response in Scandium Aluminum Nitride Alloy Thin Films Prepared by Dual Reactive Cosputtering", *Adv. Mater* 2009 , 593-596.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999 , 1879-1883.
Auld, B. A. , "Acoustic Resonators", *Acoustic Fields and Waves in Solids, Second Edition*, vol. II 1990 , 250-259.
Bauer, L. O. et al., "Properties of Silicon Implanted with Boron Ions through Thermal Silicon Dioxide", *Solid State Electronics*, vol. 16, No. 3 Mar. 1973 , 289-300.
BI, F.Z. , "Bulk Acoustic Wave RF Technology", *IEEE Microwave Magazine*, vol. 9, Issue 5. 2008 , 65-80.
Choi, Sungjin et al., "Design of Half-Bridge Piezo-Transformer Converters in the AC Adapter Applications", *APEC 2005, IEEE* Mar. 2005 , 244-248.
Coombs, Clyde F. , "Electronic Instrument Handbook", *Second Edition, McGraw-Hill, Inc.* 1995 , pp. 5.1-5.29.
Denisse, C.M.M. et al., "Plasma-Enhanced Growth and Composition of Silicon Oxynitride Films", *J. Appl. Phys.*, vol. 60, No. 7. Oct. 1, 1986 , 2536-2542.
Fattinger, G. G. et al., "Coupled Bulk Acoustic Wave Resonator Filters: Key technology for single-to-balanced RF filters", *0-7803-8331-1/4/W20.00; IEEE MTT-S Digest* 2004 , 927-929.
Fattinger, G.G. et al., "Single-To-Balance Filters for Mobile Phones Using Coupled Resonator BAW Technology", *2004 IEEE Ultrasonics Symposium* Aug. 2004 , 416-419.
Fattinger, G. B. et al., "Spurious Mode Suppression in Coupled Resonator Filters", *IEEE MTT-S International Microwave Symposium Digest* 2005 , 409-412.
Gilbert, S. R. , "An Ultra-Miniature, Low Cost Single Ended to Differential Filter for ISM Band Applications", *Micro. Symp. Digest, 2008 IEEE MTT-S* Jun. 2008 , 839-842.
Grill, A. et al., "Ultralow-K Dielectrics Prepared by Plasma-Enhanced Chemical Vapor Deposition", *App. Phys. Lett.* vol. 79 2001 , 803-805.
Hadimioglu, B. et al., ""Polymer Films As Acoustic Matching Layers".", *1990 IEEE Ultrasonics Symposium Proceedings*, vol. 3 PP. [Previously submitted as "Polymer Files As Acoustic Matching Layers, 1990 IEEE Ultrasonics Symposium Proceeding. vol. 4 PP. 1227-1340, Dec. 1990". Considered by Examiner on Mar. 20, 2007 Dec. 1990 , 1337-1340.

(56) References Cited

OTHER PUBLICATIONS

Hara, K., "Surface Treatment of Quartz Oscillator Plate by Ion Implantation", *Oyo Buturi*, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu et al., "Ultra-Miniature Coupled Resonator Filter with Single-Layer Acoustic Coupler", *IEEE Transactions on Ultrasonics Ferroelectrics, and Frequency Control*, vol. 56, No. 11. Nov. 2009, 2553-2558.

Jiang, Yimin et al., "A Novel Single-Phase Power Factor Correction Scheme", *IEEE* 1993, 287-292.

Jung, Jun-Phil et al., "Experimental And Theoretical Investigation On The Relationship Between AIN Properties and AIN-Based FBAR Characteristics", *2003 IEEE International Frequency Control Symposium and PDA Exhibition Jointly with the 17th European Frequency and Time Forum* Sep. 3, 2003, 779-784.

Kaitila, J. et al., "Measurement of Acoustical Parameters of Thin Films", *2006 IEEE Ultrasonics Symposium* Oct. 2006, 464-467.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* May 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium, San Juan, Puerto Rico* Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium, Caesar's Tahoe, NV* Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", *IEEE Ultrasonics Symposium* 2002, 939-943.

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Loboda, M. J., "New Solutions for Intermetal Dielectrics Using Trimethylsilane-Based PECVD Processes", *Microelectronics Eng.*, vol. 50. 2000, 15-23.

Martin, Steven J. et al., "Development of a Low Dielectric Constant Polymer For The Fabrication of Integrated Circuit Interconnect", *12 Advanced Materials* Dec. 23, 2000, 1769-1778.

Merriam-Webster, "Collegiate Dictionary", *tenth edition* 2000, 2 pages, definition of frame.

Navas, J. et al., "Miniaturised Battery Charger using Piezoelectric Transformers", *IEEE* 2001, 492-496.

NG, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium, Honolulu, HI* Oct. 2003, 2011-2015.

Pandey, et al., "Anchor Loss Reduction in Resonant MEMS using MESA Structures", *Proceedings of the 2nd IEEE International Conference on Nano/Micro Engineered and Molecular Systems, Bangkok, Thailand* Jan. 16-19, 2007, 880-885.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers" *IEEE Xplore* 2003, 841-846.

Schoenholz, J.E. et al., "Plasma-Enhanced Deposition of Silicon Oxynitride Films", *Thin Solid Films* 1987, 285-291.

Schuessler, Hans H., "Ceramic Filters and Resonators", *Reprinted from IEEE Trans. Sonics Ultrason.*, vol. SU-21 Oct. 1974, 257-268.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Spangenberg, B. et al., "Dependence of the Layer Resistance of Boron Implantation in Silicon and the Annealing Conditions", *Comptus Rendus de I'Academic Bulgare des Sciences*, vol. 33, No. 3 1980, 325-327.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Thomsen, C. et al., "Surface Generation and Detection of Phonons by Picosecond Light Pulses", *Phys. Rev. B*, vol. 34 1986, 4129.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys. 54 (10)* Oct. 1983, 5893-5910.

Topich, J. A. et al., "Effects of Ion Implanted Fluorine in Silicon Dioxide", *Nuclear Instr. and Methods, Cecon Rec, Cleveland, OH* May 1978, 70-73.

Tsubbouchi, K. et al., "Zero Temperature coefficient Surface Acoustic Wave Devices using Epitaxial AIN Films", *IEEE Ultrasonic symposium, San Diego, CA*, 1082 1982, 240-245.

Vasic, D et al., "A New Method to Design Piezoelectric Transformer Used in MOSFET & IGBT Drive Circuits", *IEEE 34th Annual Power Electronics Specialists Conference, 2003* vol. 1 Jun. 15-19, 2003, 307-312.

Vasic, D et al., "A New MOSFET & IGBT Gate Drive Insulated By a Piezoelectric Transformer", *IEEE 32 nd Annual Power Electronics Specialists Conference, 2001* vol. 3 2001, 1479-1484.

Yanagitani, et al., "Giant Shear Mode Electromechanical Coupling Coefficient k15 in C-Axis Tilted ScAIN Films", *IEEE International Ultrasonics Symposium* 2010.

Yang, C.M. et al., "Highly C Axis Oriented AIN Film Using MOCVD for 5GHx Band FBAR Filter", *2003 IEEE Ultrasonics Symposium* Oct. 5, 2003, pp. 170-173.

"IEEE Xplore Abstract for Suppression of Acoustic Energy Leakage in FBARS with AI Bottom Electrode: FEM Simulation and Experimental Results", Oct. 28-31, 2007, 2 pages.

(56) References Cited

OTHER PUBLICATIONS

"Machine Translation of JP 2007-208845", Aug. 16, 2007, 1-9.
"Machine Translation of JP 2008-211394", Sep. 11, 2008, 1-8.

Ohara, et al., "Suppression of Acoustic Energy Leakage in FBARs with Al Bottom Electrode: FEM Simulation and Experimental Results", 2007 IEEE Ultrasonics Symposium, Oct. 28-31, 2007, 1657-1660.

* cited by examiner

BULK ACOUSTIC WAVE RESONATOR COMPRISING BRIDGE FORMED WITHIN PIEZOELECTRIC LAYER

CROSS-REFERENCE TO RELATED APPLICATIONS

This application is a continuation-in-part application of commonly owned U.S. patent application Ser. No. 13/151,631 to Dariusz Burak et al., entitled "Film Bulk Acoustic Resonator Comprising a Bridge," filed on Jun. 2, 2011, which is a continuation-in-part application of commonly owned U.S. patent application Ser. No. 13/074,262 to Dariusz Burak et al., entitled "Stacked Acoustic Resonator Comprising a Bridge," filed on Mar. 29, 2011, which is a continuation-in-part of commonly owned U.S. patent application Ser. No. 13/036,489 to Dariusz Burak, entitled "Coupled Resonator Filter Comprising Bridge" filed on Feb. 28, 2011. The present application claims priority under 35 U.S.C. §120 to U.S. patent application Ser. Nos. 13/151,631, 13/074,262 and 13/036,489, the disclosures of which are hereby incorporated by reference in their entirety.

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signal using inverse and direct piezo-electric effects. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate acoustic waves that can propagate in all possible lateral directions when stimulated by an applied time-varying electric field, as well as higher order harmonic mixing products. The laterally propagating modes and the higher order harmonic mixing products may have a deleterious impact on functionality.

Filters based on FBAR technology provide a comparatively low in-band insertion loss due to the comparatively high quality factor (Q-factor) of FBAR devices. FBAR-based filters are often employed in cellular or mobile telephones that can operate in multiple frequency bands. In such devices, it is important that a filter intended to pass one particular frequency band ("passband") should have a high level of attenuation at other nearby frequency bands which contain signals that should be rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

Other types of filters are based on FBAR technology, including a stacked bulk acoustic resonator (SBAR), also referred to as a double bulk acoustic resonator (DBAR), and a coupled resonator filter (CRF). The DBAR includes two layers of piezoelectric materials between three electrodes in a single stack, forming a single resonant cavity. That is, a first layer of piezoelectric material is formed between a first (bottom) electrode and a second (middle) electrode, and a second layer of piezoelectric material is formed between the second (middle) electrode and a third (top) electrode. Generally, the DBAR device allows reduction of the area of a single bulk acoustic resonator device by about half.

A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different frequencies. The degree of difference in the frequencies of the modes depends, inter alia, on the degree or strength of the coupling between the two FBARs of the CRF. When the degree of coupling between the two FBARs is too great (over-coupled), the passband is unacceptably wide, and an unacceptable "swag" or "dip" in the center of the passband results, as does an attendant unacceptably high insertion loss in the center of the passband. When the degree of coupling between the FBARs is too low (under-coupled), the passband of the CRF is too narrow.

All FBARs and filters based on FBARs have an active region. The active region of a CRF, for example, comprises the region of overlap of the top FBAR, the coupling structure, and the bottom FBAR. Generally, it is desirable to confine the acoustic energy of certain desired acoustic modes within the active region. As should be appreciated by one of ordinary skill in the art, at the boundaries of the active region, reflection of desired modes can result in mode conversion into spurious/undesired modes, and loss of acoustic energy over a desired frequency range (e.g., the passband of the CRF).

In FBAR devices, mitigation of acoustic losses at the boundaries and the resultant mode confinement in the active region of the FBAR (the region of overlap of the top electrode, the piezoelectric layer, and the bottom electrode) has been effected through various methods. Notably, frames are provided along one or more sides of the FBARs. The frames create an acoustic impedance mismatch that reduces losses by reflecting desired modes back to the active area of the resonator, thus improving the confinement of desired modes within the active region of the FBAR.

While the incorporation of frames has resulted in improved mode confinement and attendant improvement in the Q-factor of the FBAR, direct application of known frame elements has not resulted in significant improvement in mode confinement and Q-factor of conventional DBARs and CRFs. Better acoustic energy confinement, as well as further improvements in FBAR Q-factor due to the better acoustic energy confinement, are needed for increased efficiency of FBARs, DBARs and CRFs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
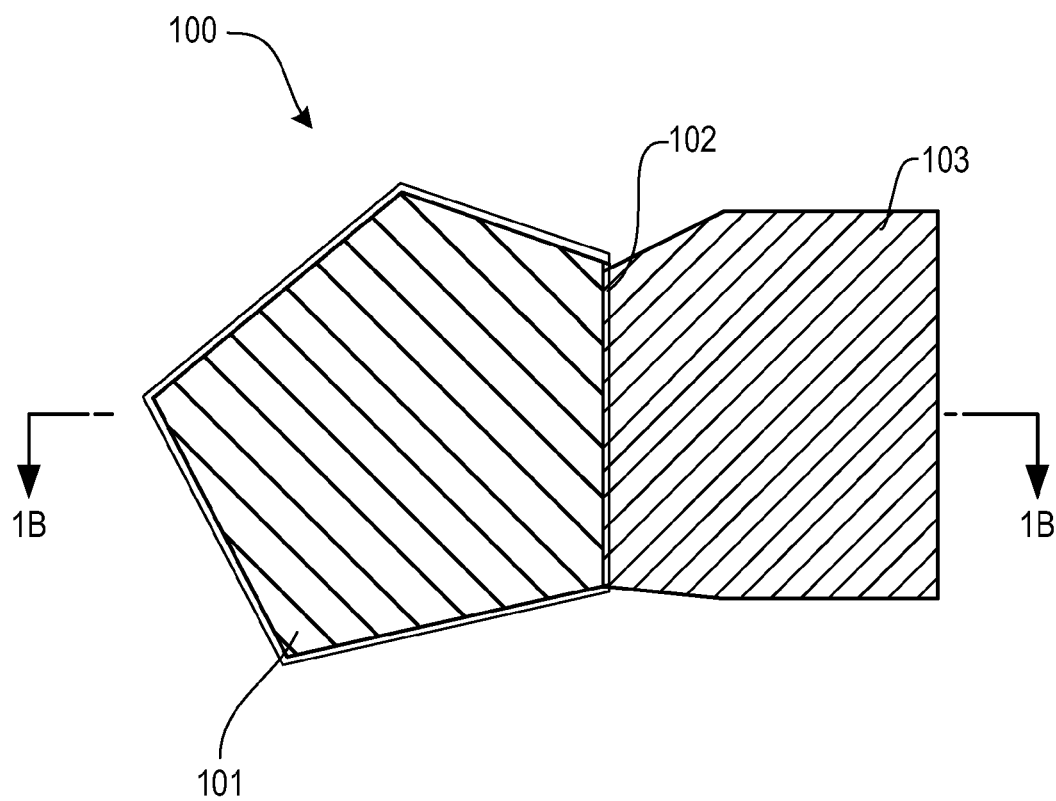
FIG. 1A shows a top-view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator structures comprising FBARs. In certain applications, the BAW resonator structures provide FBAR-based filters (e.g., ladder filters). Certain details of FBARs and/or BAW resonators and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

Embodiments Comprising FBARs

FIG. 1A shows a top view of FBAR 100 in accordance with a representative embodiment. The FBAR 100 includes a top electrode 101 (referred to below as second electrode 101) having five (5) sides, with a connection side 102 configured to provide an electrical connection to interconnect 103. The interconnect 103 provides electrical signals to the second electrode 101 to excite desired acoustic waves in a piezoelectric layer (not shown in FIG. 1A) of the FBAR 100.

Figure 1B:
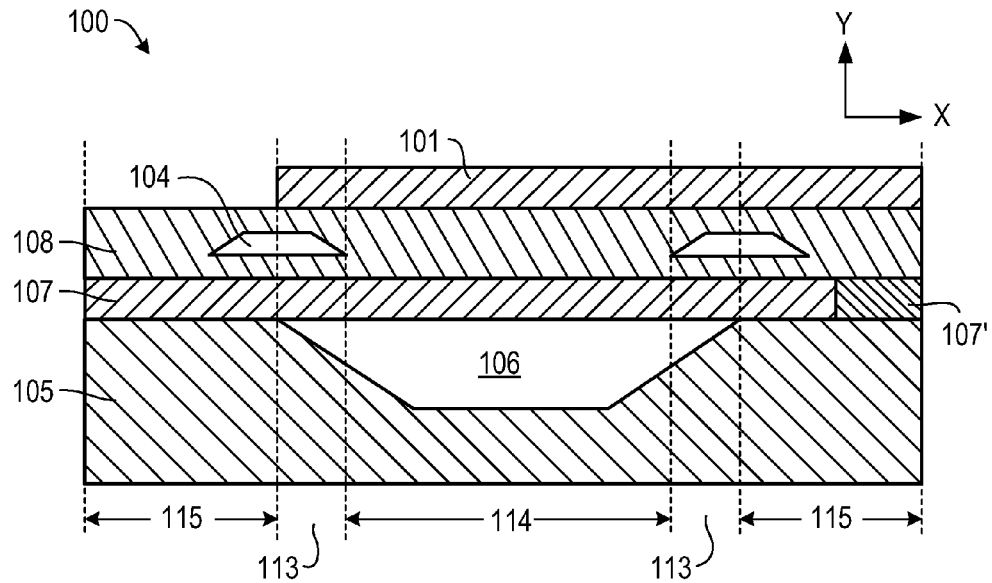
FIG. 1B is a cross-sectional view of the FBAR of FIG. 1A, taken along the line 1B-1B, having a bridge disposed within a piezoelectric layer, in accordance with a representative embodiment.

FIG. 1B shows a cross-sectional view of the FBAR 100 taken along line 1B-1B in accordance with a representative embodiment. The FBAR 100 includes multiple layers stacked over substrate 105 having a cavity 106. The inclusion of a cavity 106 for reflection of acoustic waves in the FBAR 100 is merely illustrative. In various alternative configurations, a known acoustic reflector (e.g., a Bragg mirror (not shown)) comprising alternating layers of high and low acoustic impedance may be provided in the substrate 105 to provide acoustic isolation in place of the cavity 106, without departing from the scope of the present teachings.

A first (bottom) electrode 107 is disposed over the substrate 105 and partially over the cavity 106 (or Bragg mirror). A planarization layer 107' is also provided over the substrate as shown. In a representative embodiment, the planarization layer 107' includes non-etchable borosilicate glass (NEBSG), for example. In general, planarization layer 107' does not need to be present in the structure (as it increases overall processing cost), but when present, it may improve quality of growth of subsequent layers and simplify their processing. A piezoelectric layer 108 is disposed over the first electrode 107, and the second (top) electrode 101 is disposed over the piezoelectric layer 108. As should be appreciated by one of ordinary skill in the art, the structure provided by the first electrode 107, the piezoelectric layer 108 and the second electrode 101 is a bulk acoustic wave (BAW) resonator. When the BAW resonator is disposed over a cavity, it is a so-called FBAR (e.g., FBAR 100); and when the BAW resonator is disposed over an acoustic reflector (e.g., Bragg mirror), it is a so-called solidly mounted resonator (SMR). The present teachings contemplate the use of either FBARs or SMRs in a variety of applications, including filters (e.g., ladder filters comprising a plurality of BAW resonators).

In the depicted embodiment, a bridge 104 is buried within the piezoelectric layer 108, meaning that the bridge 104 is surrounded by the piezoelectric material of the piezoelectric layer 108. The bridge 104 is disposed along all sides of the FBAR 100 (i.e., along a perimeter of the FBAR 100). For example, in representative embodiments, the bridge 104 (and other bridges described in connection with representative embodiments below) has a trapezoidal cross-sectional shape. It is emphasized that the trapezoidal cross-sectional shape of the bridge of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of bridge 104 (and other bridges described in connection with representative embodiments below) are beneficial to the quality of layers (e.g., the quality of the crystalline piezoelectric layer(s)) grown over the bridge 104 (and other bridges described in connection with representative embodiments below). Typical dimensions of the bridge 104 (and other bridges described in connection with representative embodiments below) are approximately 2.0 µm to approximately 10.0 µm in width (x-dimension in the coordinate system shown in FIG. 1B) and approximately 150 Å to approximately 3000 Å in height (y-dimension in the coordinate system shown in FIG. 1B).

In certain embodiments, the bridge 104 (and other bridges described in connection with representative embodiments below) extends over the cavity 106 (depicted as overlap 113 in FIG. 1B). The overlap 113 (also referred to as the decoupling region) has a width (x-dimension) of approximately 0.0 µm (i.e., no overlap with the cavity 106) to approximately 10.0 µm. Generally, optimum width of the bridge 104 (and other bridges described in connection with representative embodiments below) depends on the reflection of the eigen-modes at the boundary of an active region 114 (also referred to herein as an FBAR region) and a decoupling region (i.e., the overlap 113). Due to the smaller thickness of layers in the decoupling region 113, only complex evanescent modes for the thickness-extensional motion can exist at the operating frequency of the FBAR 100. These complex evanescent modes are characterized by a characteristic decay length and by a specific propagation constant. The bridge 104 needs to be wide enough to ensure suitable decay of complex evanescent waves excited at the boundary of FBAR region 114 and the decoupling region 113. Wide bridges minimize tunneling of energy into a field region 115 where propagating modes exist at the frequency of operation. On the other hand, if the bridge 104 is too wide, reliability issues can arise and can also limit the placement of similar FBARs (not shown) from being placed in proximity (thus unnecessarily increasing the total area of a chip). In practical situations, the propagating component of the complex evanescent wave can be used to find the optimum width of the bridge 104. In general, when the width of bridge 104 is equal to an odd multiple of the quarter-wavelength of the complex evanescent wave, the reflectivity of the eigen-modes can be further increased, which can be manifested by parallel resistance Rp and Q-factor attaining maximum values. Typically, depending on the details of the excitation mechanism, other propagating modes of the decoupling region 113, such as shear modes and flexural modes, can impact Rp and Q-factor. The width of the bridge 104 can be modified in view of these other propogating modes. Such optimum width of the bridge 104 may be determined experimentally.

In addition, the width and position of the bridge 104 (and other bridges described in connection with representative embodiments) and the amount of the overlap 113 with the cavity 106 are selected to improve Q-factor enhancement of the resonant piston mode. In general, the greater the overlap 113 of the bridge 104 with the cavity 106 of the FBAR 100, the greater the improvement in the Q-factor, with the improvement realized being fairly small after an initial increase. The improvement in the Q-factor must be weighed against a decrease in the electromechanical effective coupling coefficient $kt^2$, which decreases with increasing overlap 113 of the bridge 104 with the cavity 106. Degradation of the coupling coefficient $kt^2$ results in a degradation of insertion loss ($S_{21}$) of a filter comprising FBARs. As such, the overlap 113 of the bridge 104 with the cavity 106 may be optimized experimentally.

The bridge 104 (and other bridges described in connection with representative embodiments below) has a height (y-dimension in the coordinate system of FIG. 1B) of approximately 150 Å to approximately 3000 Å. Notably, the lower limit of the height is determined by the limits of the process of releasing sacrificial material in the forming of the bridge 104 (and other bridges described in connection with representative embodiments below), and the upper limit of the height is determined by the quality of layers grown over the bridge 104 (and other bridges described in connection with representative embodiments) and by the quality of subsequent processing of possibly non-planar structures.

Illustratively, the first electrode 107 and second electrode 101 are formed of tungsten (W) having a thickness of approximately 1000 Å to approximately 20000 Å. Other materials may be used for the first electrode 107 and the second electrode 101, including but not limited to molybdenum (Mo), iridium (Ir), copper (Cu), aluminum (Al) or a bi-metal material. Illustratively, the piezoelectric layer 108 is formed of aluminum nitride (AlN) having a thickness of approximately 5000 Å to approximately 25000 Å. Other materials may be used for the piezoelectric layer 108, including but not limited to zinc oxide (ZnO).

In order to form the bridge 104, growth of the piezoelectric layer 108 on the first electrode 107 is interrupted. In the depicted embodiment, the growth of the piezoelectric layer 108 was interrupted at about half way through the anticipated thickness, resulting in formation the bridge 104 in approximately the middle of the completed piezoelectric layer 108. This location places the bridge 104 at about the point of maximum stress of the piezoelectric layer 108, maximizing the energy decoupling effect of the bridge 104. However, the bridge 104 may be formed in different relative locations within the piezoelectric layer 108 without departing from the scope of the present teachings. Once the growth of the piezoelectric layer 108 is interrupted, the bridge 104 may be formed by patterning a sacrificial material over the grown portion of the piezoelectric layer 108, and then continuing growth of the remaining portion of the piezoelectric layer 108 thereover. After the other layers of the FBAR 100 are formed as desired (e.g., the second electrode 101), the sacrificial material is released leaving the bridge 104 "unfilled" (i.e., containing or filled with air). In a representative embodiment, the sacrificial material used to form the bridge 104 is the same as the sacrificial material used to form the cavity 106, such as phosphosilicate glass (PSG), for example.

In a representative embodiment, the bridge 104 defines a perimeter along the active region 114 of the FBAR 100. The active region 114 thus includes the portions of the acoustic resonator disposed over the cavity 106 and bounded by the perimeter provided by the bridge 104. As should be appreciated by one of ordinary skill in the art, the active region of the FBAR 100 is bordered around its perimeter by an acoustic impedance discontinuity created at least in part by the bridge 104, and above and below (cavity 106) by an acoustic impedance discontinuity due to the presence of air. Thus, a resonant cavity is beneficially provided in the active region of the FBAR 100. In the depicted embodiment, the bridge 104 is unfilled (i.e., contains air), as is the cavity 106. In other embodiments, the bridge 104 is "filled" (i.e., contains a dielectric or metal material having an acoustic impedance to provide the desired acoustic impedance discontinuity) to provide bridge 104', described more fully below with reference to FIG. 1C. It is noted that the bridge 104 does not necessarily have to extend along all edges of the FBAR 100, and therefore not along the perimeter of the FBAR 100. For example, the bridge 104 may be provided on four "sides" of the five-sided FBAR 100 shown in FIG. 1A.

The acoustic impedance mismatch provided by the bridge 104 causes reflection of acoustic waves at the boundary that may otherwise propagate out of the active region and be lost, resulting in energy loss. The bridge 104 serves to confine the modes of interest within the active region 114 of the FBAR 100 and to reduce energy losses in the FBAR 100. Reducing such losses serves to increase the Q-factor of the FBAR 100. In filter applications of the FBAR 100, as a result of the reduced energy loss, the insertion loss ($S_{21}$) is beneficially improved.

In an illustrative configuration, it may be assumed for purpose of explanation that the bridge 104 has a width (x-dimension) of approximately 5.0 µm, a height of approximately 1500 Å, and an overlap 113 of approximately 2.0 µm, that the piezoelectric layer 108 has a thickness (y-dimension) of approximately 10000 Å, and that the bottom of the bridge 104 is approximately 5000 Å above the bottom of the piezoelectric layer 108, such that the bridge 104 is in about the middle of the piezoelectric layer 108. Placement of the bridge 104 in about the middle of the piezoelectric layer 108 increases parallel resistance Rp of the FBAR 100 from about 1.1 kΩ to about 3.5 kΩ, which is an increase of over 300 percent, e.g., at a frequency of operation of about 1.88 GHz. Since the bridge 104 is generally placed in a region of maximum stress, the impact of two competing phenomena is maximized: scattering at the leading edge of the bridge 104 (which generally leads to decrease of Q-factor) and decoupling of FBAR modes from the field region modes due to zeroing of normal stress at the upper and lower boundaries of the bridge 104 (which in general leads to increase of Q-factor). A third effect (also generally leading to decrease of Q-factor) is related to poorer quality of piezoelectric material in the region grown immediately above the stop-growth plane. These three factors are weighed appropriately when determining placement of the bridge 104 within the piezoelectric layer 108, and such optimization may be done experimentally, for example.

Figure 1C:
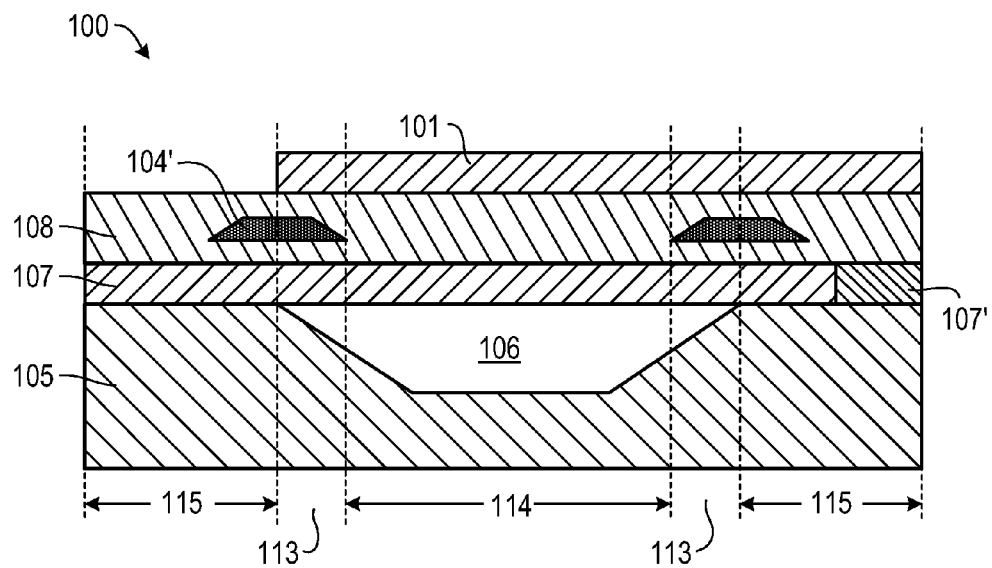
FIG. 1C is a cross-sectional view of an FBAR, having a bridge disposed within a piezoelectric layer, in accordance with another representative embodiment.

As mentioned above, in the representative embodiment shown and described in connection with FIGS. 1A and 1B, the bridge 104 is unfilled (i.e., contains air as the acoustic medium). FIG. 1C shows a cross-sectional view of FBAR 100 in which the bridge is "filled" with a material having an acoustic impedance in order to provide significantly large lateral acoustic impedance discontinuity at the boundary between FBAR region 114 and decoupling region 113. The mechanism of reducing losses in the filled bridge 104' relies on suppression and confinement of the propagating eigen-modes which are electrically excited in the FBAR region 114 as a part of piston mode excitation. Both ends of the filled bridge 104' provide mechanical discontinuities to control the phase of the reflected mode and to provide overall beneficial suppression of the propagating eigen-modes in the main FBAR region 114. Moreover, in the decoupling region 113, the main part of the piston mode becomes evanescent, that is, its amplitude decreases exponentially as it propagates towards the field region 115. This decay process minimizes conversion of the piston mode into unwanted propagating modes at the impedance discontinuity regions created by the edges of the cavity 106 and the substrate 105, thus leading to further beneficial increase of Q-factor.

In certain embodiments, bridge 104' is filled with NEBSG, carbon doped oxide (CDO), silicon carbide (SiC) or other suitable dielectric material that will not release when the sacrificial material disposed in the cavity 106 is released. In other embodiments, bridge 104' is filled with one of tungsten (W), molybdenum (Mo), copper (Cu), iridium (Ir) or other suitable metal materials that will not release when the sacrificial material disposed in the cavity 106 is released. The bridge 104' is fabricated by interrupting growth of the piezoelectric layer 108 on the first electrode 107, for example, when the piezoelectric layer 108 is about half its desired thickness, resulting in formation the bridge 104' in approximately the middle of the completed piezoelectric layer 108. Once the growth of the piezoelectric layer 108 is interrupted, the NEBSG or other fill material is formed by a known method. The FBAR 100 is completed by continuing the growth of the remaining portion of the piezoelectric layer 108, and forming the second electrode 101 of the FBAR 100 thereover. When the cavity 106 is formed through the release of the sacrificial, the bridge 104' remains filled with the selected, non-etchable material.

Forming bridges within piezoelectric layer(s) may be implemented in other types of acoustic resonators, including DBARs and CRFs, resulting in similar improvements in parallel resistance Rp, Q-factors, and the like. For example, FIGS. 2A-4B show cross-sectional views of DBARs 200-400, respectively, and FIGS. 5A-7B show cross-sectional views of CRFs 500-700, respectively, in accordance with representative embodiments.

Embodiments Comprising DBARs

FIGS. 2A-2D show cross-sectional views of DBAR 200 in accordance with representative embodiments. It may be assumed for purposes of explanation that the top view of the DBAR 200 is substantially the same as the top view of the FBAR 100, discussed above with reference to FIG. 1A. That is, the DBAR 200 may include a top electrode 101 (referred to below as third electrode 101), comprising five (5) sides, with a connection side 102 configured to provide the electrical connection to an interconnect 103.

Figure 2A:
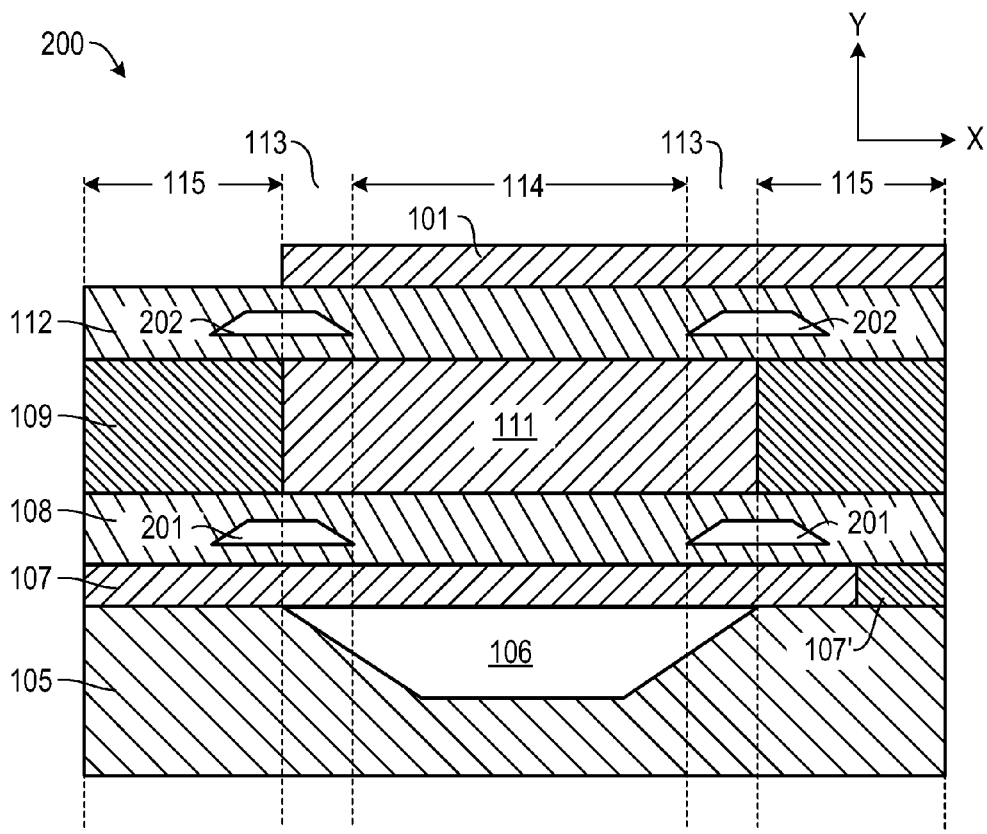
FIGS. 2A-2D are cross-sectional views of DBARs, each having bridges disposed within two piezoelectric layers of the DBAR, in accordance with a representative embodiment.

Referring to FIG. 2A, the DBAR 200 comprises a plurality of layers disposed over a substrate 105 having a cavity 106. The inclusion of a cavity 106 for reflection of acoustic waves in the DBAR 200 is merely illustrative. It is emphasized that rather than cavity 106, a known acoustic reflector (e.g., a Bragg mirror (not shown)) comprising alternating layers of high and low acoustic impedance may be provided in the substrate 105 to provide acoustic isolation. The plurality of layers includes first (bottom) electrode 107, first piezoelectric layer 108, second (middle) electrode 111, second piezoelectric layer 112, and third (top) electrode 101, discussed below.

The first electrode 107 is disposed over the substrate 105 and partially over the cavity 106 (or Bragg mirror). A planarization layer 107' is provided over the substrate as shown. In a representative embodiment, the planarization layer 107' comprises NEBSG. The first piezoelectric layer 108 is disposed over the first electrode 107, and a first bridge 201 is included within the first piezoelectric layer 108, meaning that the first bridge 201 is surrounded by the piezoelectric material of the first piezoelectric layer 108, as discussed above with reference to bridge 104. The first bridge 201 is disposed along all sides (i.e., along the perimeter) of the DBAR 200. The second electrode 111 and a planarization layer 109 are disposed over the first piezoelectric layer 108, where the planarization layer 109 generally does not overlap the cavity 106. In a representative embodiment, the planarization layer 109 comprises NEBSG. As should be appreciated by one of ordinary skill in the art, the structure provided by the first electrode 107, the first piezoelectric layer 108 and a second electrode 111 is a BAW resonator, which in this illustrative embodiment comprises a first BAW resonator of the DBAR 200. When the BAW resonator is disposed over a cavity, it is a so-called FBAR; and when the BAW resonator is disposed over an acoustic reflector (e.g., Bragg mirror) it is a so-called SMR.

The second piezoelectric layer 112 is provided over the second electrode 111 and the planarization layer 109, and a second bridge 202 is included within the second piezoelectric layer 112, meaning that the second bridge 202 is surrounded by the piezoelectric material of the second piezoelectric layer 112, as discussed above with reference to bridge 104. The third electrode 101 is provided over the second piezoelectric layer 112. The second bridge 202 is disposed along all sides (i.e., along the perimeter) of the DBAR 200. As should be appreciated by one of ordinary skill in the art, the structure provided by the second electrode 111, the second piezoelectric layer 112 and the third electrode 101 is a BAW resonator, which in this illustrative embodiment comprises a second BAW resonator of the DBAR 200. As mentioned above, when the BAW resonator is disposed over a cavity, it is a so-called FBAR; and when the BAW resonator is disposed over an acoustic reflector (e.g., Bragg mirror), it is a so-called SMR. The present teachings contemplate the use of either FBARs or SMRs to form DBARs. The DBARs are contemplated for a variety of uses, including filters (e.g., ladder filters comprising a plurality of BAW resonators).

Illustratively, the first electrode 107, the second electrode 111 and the third electrode 101 are formed of W having a thickness of approximately 1000 Å to approximately 20000 Å. Other materials may be used for the first electrode 107, the second electrode 111 and the third electrode 101, including but not limited to Mo or a bi-metal material. Illustratively, the first piezoelectric layer 108 and the second piezoelectric layer 112 are AlN having a thickness of approximately 5000 Å to approximately 15000 Å. Other materials may be used for the first piezoelectric layer 108 and the second piezoelectric layer 112, including but not limited to ZnO.

In representative embodiments, the configuration of the first and second bridges 201, 202 may be substantially the same as the bridge 104 discussed above with reference to FIG. 1B. Notably, the first bridge 201 and the second bridge 202 are not necessarily the same shape (e.g., one could have trapezoidal cross-sectional shape and one could have a rectangular cross-sectional in shape). For example, dimensions of the first and second bridges 201, 202 may be approximately 2.0 μm to approximately 10.0 μm in width (x-dimension in the coordinate system shown in FIG. 2A) and approximately 150 Å to approximately 3000 Å in height (y-dimension in the coordinate system shown in FIG. 2A).

Further, in certain embodiments, the first and second bridges 201, 202 extend over the cavity 106 by overlap 113. The overlap 113 (also referred to as the decoupling region) has a width (x-dimension) of approximately 0.0 μm (i.e., no overlap with the cavity 106) to approximately 10.0 μm. Notably, the first bridge 201 and the second bridge 202 do not need to be the same dimensions or located at the same relative position. For example, the overlap 113 of the first and second bridges 201, 202 with cavity 106 is shown in FIG. 2A to be identical; but this is not essential as different first and second bridges 201, 202 may overlap the cavity 106 to a greater or lesser extent than other bridges 201, 202.

Generally, the same considerations apply when designing bridges 201 and 202 for DBAR 200 as described for bridge 104 for FBAR 100 in connection with FIGS. 1B and 1C. For example, the first and second bridges 201, 202 need to be wide enough to ensure suitable decay of evanescent waves at the boundary of an active region 114 (also referred to herein as a DBAR region) and the decoupling region (i.e., overlap 113) in order to minimize tunneling of modes into a field region 115 where propagating modes exist at the frequency of operation. On the other hand, if the first and second bridges 201, 202 are too wide, reliability issues can arise and can also limit the placement of similar DBARs (not shown) from being placed in proximity (thus unnecessary increasing the total area of a chip). As such, the optimum width of the first and second bridges 201, 202 may be determined experimentally.

In addition, the width and position of the first and second bridges 201, 202 and overlap 113 with the cavity 106 are selected to improve Q-enhancement of the odd resonant mode. In general, the greater the overlap 113 of each of the first and second bridges 201, 202 with the cavity 106 of the DBAR 200, the greater the improvement of Q-factor with the improvement realized being fairly small after an initial increase. The improvement in Q-factor must be weighed against a decrease in the electromechanical effective coupling coefficient $kt^2$, which decreases with increasing the overlap 113 of the first and second bridges 201, 202 with the cavity 106. Degradation of the coupling coefficient $kt^2$ results in a degradation of insertion loss ($S_{21}$) of a filter comprising DBARs. As such, the overlap 113 of the first and second bridges 201, 202 with the cavity 106 may be optimized experimentally.

In order to form the first bridge 201, growth of the first piezoelectric layer 108 on the first electrode 107 is interrupted. Likewise, in order to form the second bridge 202, growth of the second piezoelectric layer 112 on the second electrode 111 is interrupted. In the depicted embodiment, the growth of the first and second piezoelectric layers 108, 112 were interrupted at about half way through the anticipated thickness, resulting in formation the first and second bridges 201, 202 in approximately the middle of the completed first and second piezoelectric layers 108, 112, respectively, as discussed above. However, the first and second bridges 201, 202 may be formed in different relative locations within the first and second piezoelectric layers 108, 112, without departing from the scope of the present teachings. Once the growth of the first piezoelectric layer 108 is interrupted, the first bridge 201 may be formed by patterning a sacrificial material over the grown portion of the first piezoelectric layer 108, and then continuing growth of the remaining portion of the first piezoelectric layer 108 thereover. Likewise, after formation of the second electrode 111, the growth of the second piezoelectric layer 112 is interrupted, and the second bridge 202 may be formed by patterning a sacrificial material over the grown portion of the second piezoelectric layer 112. Growth of the remaining portion of the second piezoelectric layer 112 is then continued thereover. After the other layers of the DBAR 200 are formed as desired (e.g., the third electrode 101), the sacrificial material is released leaving the first and second bridges 201, 202 "unfilled." In a representative embodiment, the sacrificial material used to form the first and second bridges 201, 202 is the same as the sacrificial material used to form the cavity 106, such as PSG, for example.

In a representative embodiment, the first bridge 201 and the second bridge 202 define a perimeter along the active region 114 of the DBAR 200. The active region 114 thus includes the portions of the first BAW resonator and the second BAW resonator disposed over the cavity 106 and bounded by the perimeter provided by the first bridge 201 and the second bridge 202. As should be appreciated by one of ordinary skill in the art, the active region of the DBAR 200 is bordered around its perimeter by an acoustic impedance discontinuity created at least in part by the first and second bridges 201, 202, and above and below (cavity 106) by an acoustic impedance discontinuity due to the presence of air. Thus, a resonant cavity is beneficially provided in the active region of the DBAR 200. In certain embodiments, the first bridge 201 and the second bridge 202 are unfilled (i.e., contain air), as is the cavity 106. In other embodiments described more fully below, the first bridge 201, or the second bridge 202, or both, are filled with a material to provide the desired acoustic impedance discontinuity.

It is noted that the first bridge 201, or the second bridge 202, or both, do not necessarily have to extend along all edges of the DBAR 200, and therefore not along the perimeter of the DBAR 200. For example, the first bridge 201 or the second bridge 202, or both, may be provided on four "sides" of a five-sided DBAR 200 (similar to the five-sided FBAR 100 shown in FIG. 1A). In certain embodiments, the first bridge 201 is disposed along the same four sides of the DBAR 200 as the second bridge 202. In other embodiments, the first bridge 201 is disposed along four sides (e.g., all sides but the connection side 102) of the DBAR 200 and the second bridge 202 is disposed along four sides of the DBAR 200, but not the same four sides as the first bridge 201 (e.g., second bridge 202 is disposed along the connection side 102).

The acoustic impedance mismatch provided by the first bridge 201 and the second bridge 202 causes reflection of acoustic waves at the boundary that may otherwise propagate out of the active region and be lost, resulting in energy loss. The first bridge 201 and the second bridge 202 serve to confine the modes of interest within the active region 114 of the DBAR 200 and reduce energy losses in the DBAR 200. Reducing such losses serves to increase the Q-factor of the modes of interest in the DBAR 200. In filter applications of the DBAR 200, as a result of the reduced energy loss, the insertion loss ($S_{21}$) is beneficially improved.

Figure 2B:
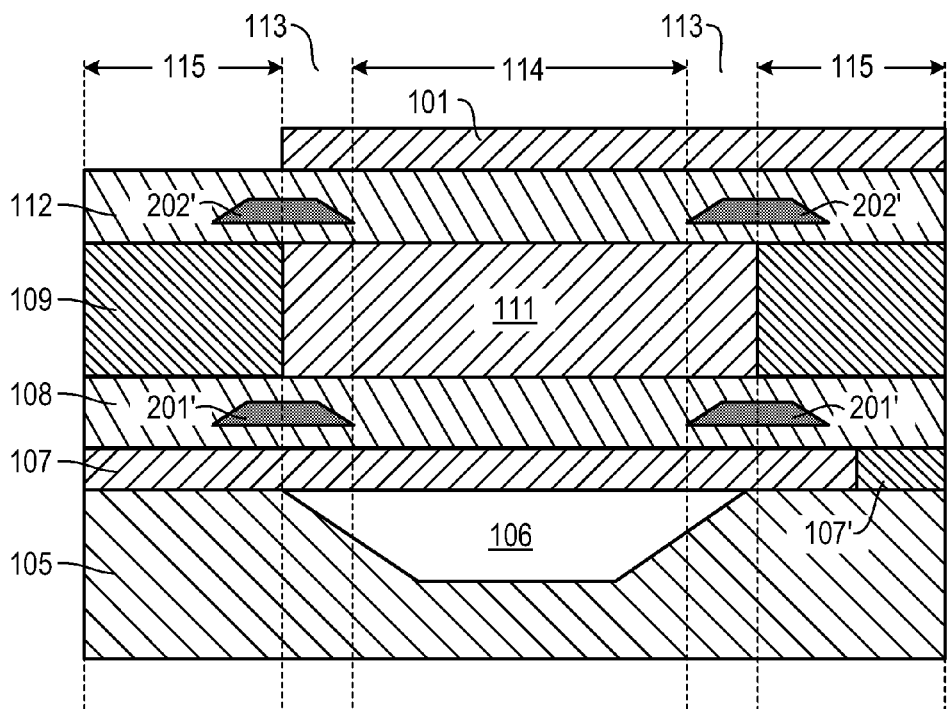

In the representative embodiment shown and described in connection with FIG. 2A, the first and second bridges 201, 202 are unfilled (i.e., contain air as the acoustic medium). FIG. 2B shows a cross-sectional view of DBAR 200 in which both bridges, indicated as first bridge 201' and second bridge 202', are filled with a material to provide the acoustic impedance discontinuity to reduce losses. In certain embodiments, first bridge 201' and second bridge 202' are filled with NEBSG, CDO, SiC or other suitable dielectric material that will not release when the sacrificial material disposed in the cavity 106 is released. In other embodiments, the first bridge 201' and the second bridge 202' are filled with one of tungsten (W), molybdenum (Mo), copper (Cu), iridium (Ir) or other suitable metal materials that will not release when the sacrificial material disposed in the cavity 106 is released. The first and second bridges 201', 202' are fabricated by forming the NEBSG or other fill material within the first piezoelectric layer 108 and the second piezoelectric layer 112, respectively, by interrupting growth of the first and second piezoelectric layers 108, 112, as discussed above, and forming respective layers of the DBAR 200 thereover. When the cavity 106 is formed through the release of the sacrificial, the first bridge 201' and the second bridge 202' remain "filled" with the selected, non-etchable material.

Figure 2C:
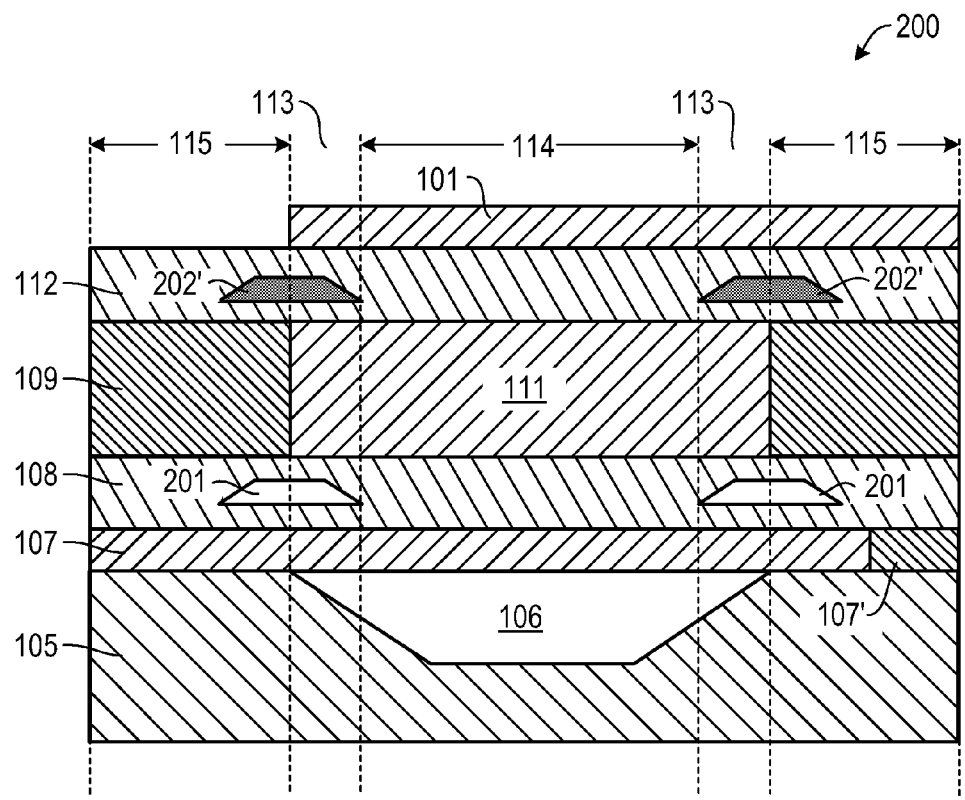

FIG. 2C shows a cross-sectional view of DBAR 200 in which the second bridge 202' is filled with a material to provide the acoustic impedance discontinuity to reduce losses, and the first bridge 201 is filled with air. This modification of the DBAR 200 is fabricated by patterning a material (e.g., NEBSG) within the second piezoelectric layer 112 that will not release before forming the third electrode 101. The first bridge 201 is formed by patterning a sacrificial material within the first piezoelectric layer 108, and releasing the sacrificial material as described above.

Figure 2D:
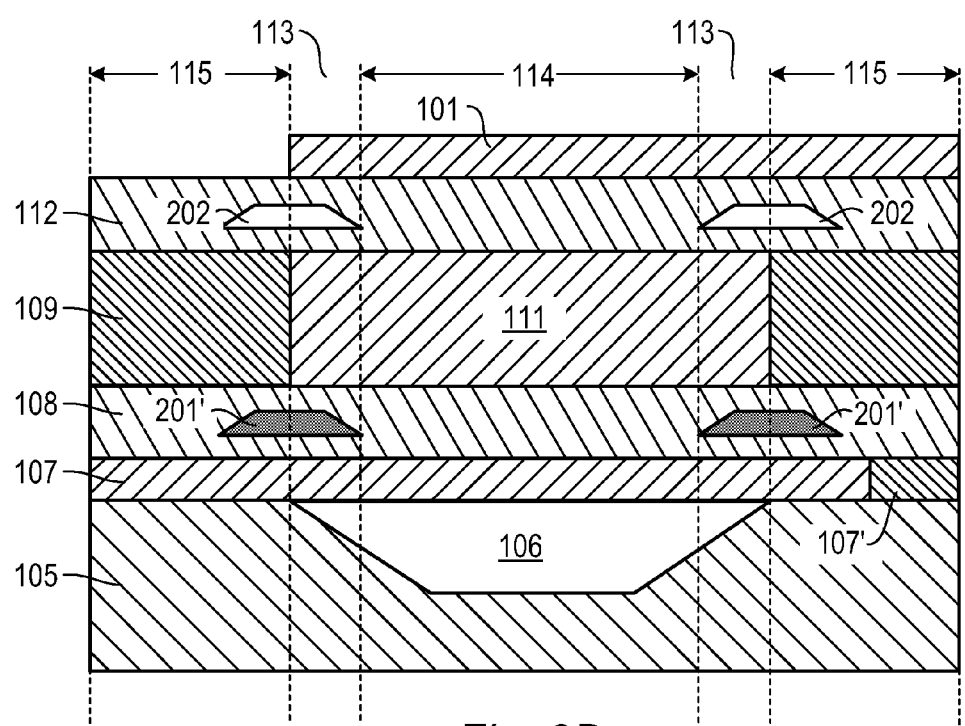

FIG. 2D shows a cross-sectional view of DBAR 200 in which the second bridge 202 is filled with air, and the first bridge 201' is filled with a material to provide the acoustic impedance discontinuity to reduce losses. This modification of the DBAR 200 is fabricated by patterning a material (e.g., NEBSG) within the first piezoelectric layer 108 that will not release before forming the second electrode 111. The second bridge 202 is formed by patterning a sacrificial material within the second piezoelectric layer 112, and releasing the sacrificial material as described above.

In the embodiments described presently, a single bridge is provided in an illustrative DBAR. The single bridge is provided within a single piezoelectric layer in each embodiment, and forms a perimeter that encloses the active region of the DBAR. By placing the bridge within different piezoelectric layers, the various embodiments can be studied to test the degree of coupling of modes in the active region (DBAR region) and the modes in the field region. Generally, the bridge decouples modes with a comparatively large propagation constant ($k_r$) from the modes in the field region. As described below, certain embodiments comprise an "unfilled" bridge and certain embodiments comprise a "filled" bridge. Many details of the present embodiments are common to those described above in connection with the representative embodiments of FIGS. 1A-1C and 2A-2D. Generally, the common details are not repeated in the description of embodiments comprising a single bridge.

Figure 3A:
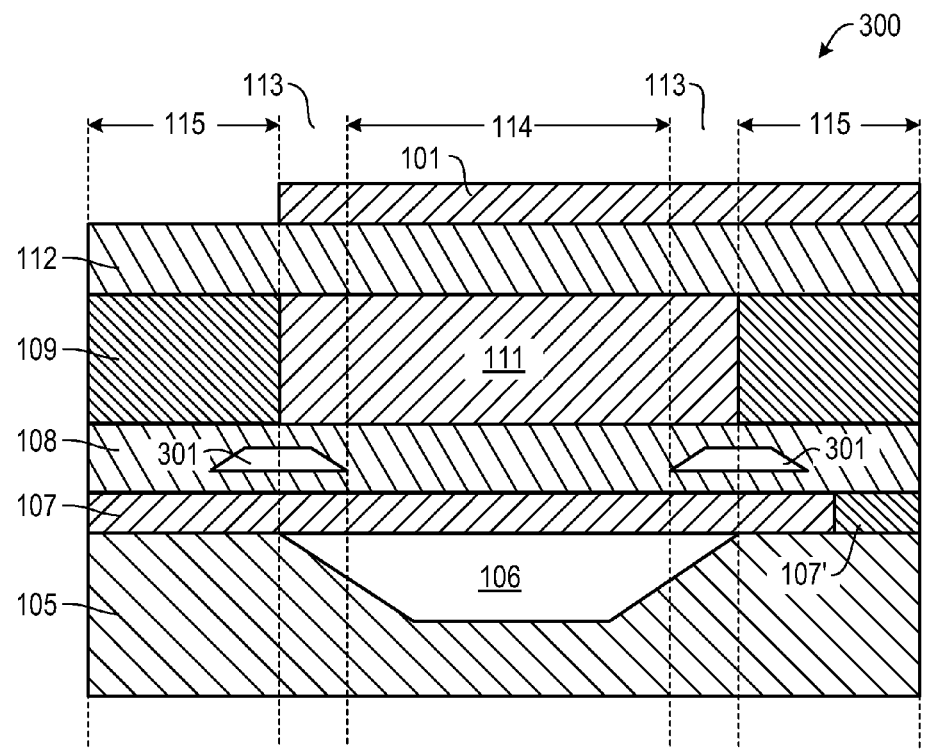
FIGS. 3A-3B are cross-sectional views of DBARs, each having a bridge disposed within a piezoelectric layer of the DBAR, in accordance with a representative embodiment.
Figure 3B:
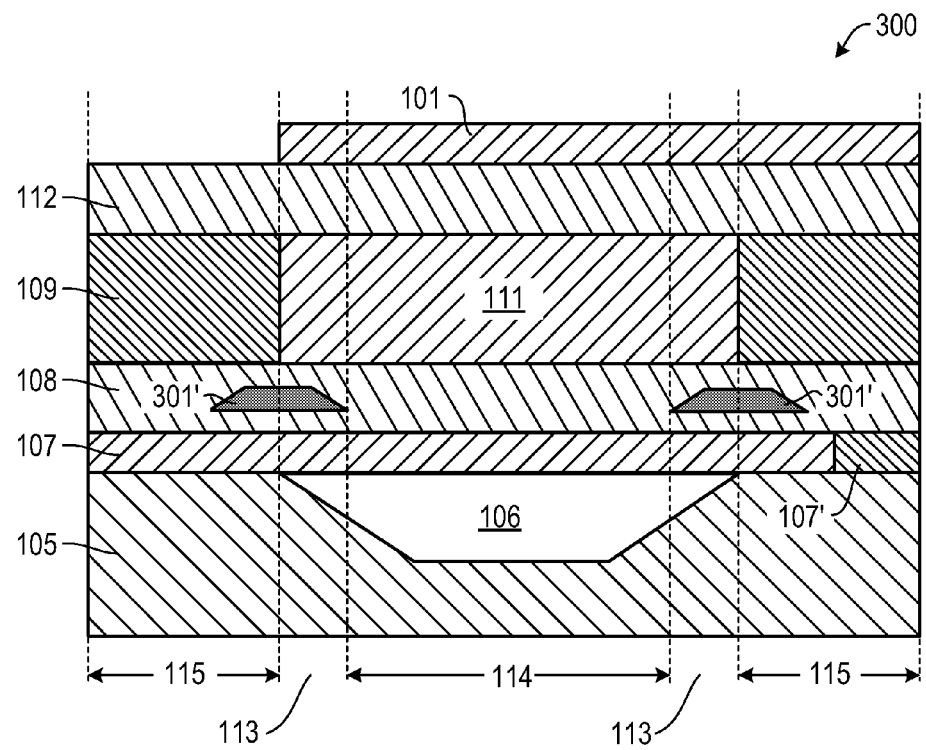

FIGS. 3A and 3B show cross-sectional views of a DBAR 300 in accordance with representative embodiments. The DBAR 300 comprises a plurality of layers disposed over a substrate 105 having a cavity 106. Many aspects of the DBAR 300 are common to those of DBAR 200, described above, and are not repeated in order to avoid obscuring the description of the representative embodiments presently described.

FIG. 3A shows a bridge 301 provided within the first piezoelectric layer 108. The bridge 301 is unfilled (i.e., contains air). Bridge 301 is disposed around the perimeter of the active region 114 of the DBAR 300, and fosters confinement of modes in the active region 114 of the DBAR 300. For purposes of illustration of the improvement in mode confinement in the active region 114 of the DBAR 300, the bridge 301 having a width (x-dimension) of approximately 5.0 μm, a height of approximately 500 Å, and overlap 113 of the cavity 106 by approximately 2.0 μm was provided. An increase in Q-factor of approximately 100% (depending on frequency of operation, e.g., at parallel resonance frequency) may be expected compared to a known DBAR that does not include a bridge.

FIG. 3B shows a bridge 301' provided within the first piezoelectric layer 108 of DBAR 300. The bridge 301' is "filled" with a material (e.g., NEBSG or other material described above) to provide an acoustic impedance discontinuity. Bridge 301' is disposed around the perimeter of the active region 114 of the DBAR 300, and fosters confinement of modes in the active region 114 of the DBAR 300. Similar improvements in Q-factor expected for bridge 301 are expected with the use of bridge 301'. Beneficially, the use of a filled bridge provides a more rugged structure.

Figure 4A:
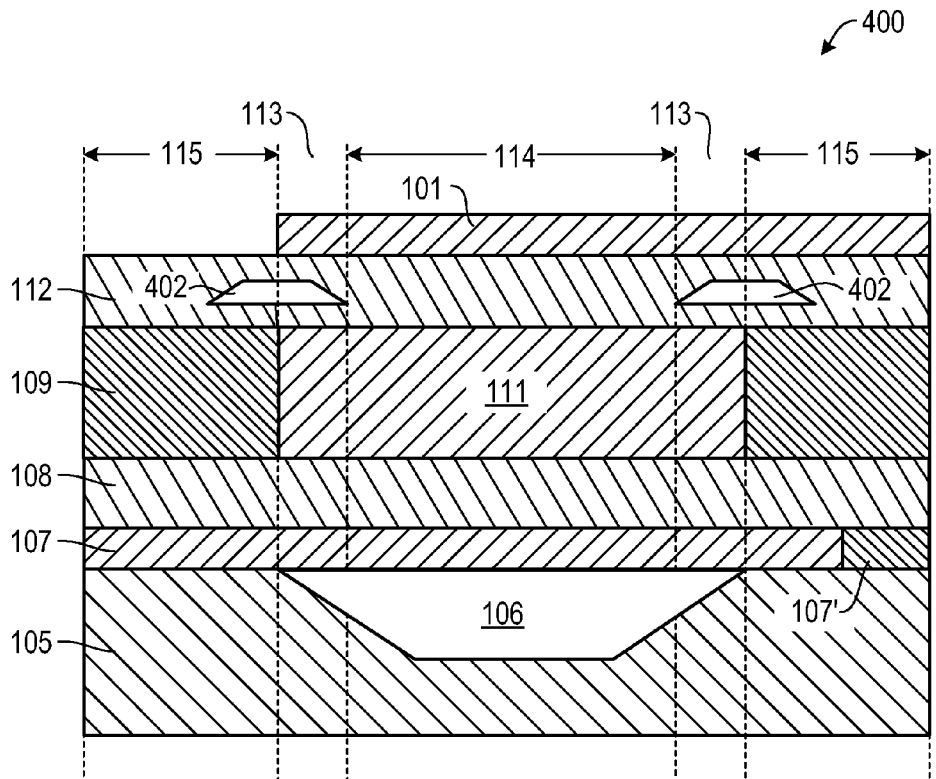
FIGS. 4A-4B are cross-sectional views of DBARs, each having a bridge disposed within another piezoelectric layer of the DBAR, in accordance with a representative embodiment.
Figure 4B:
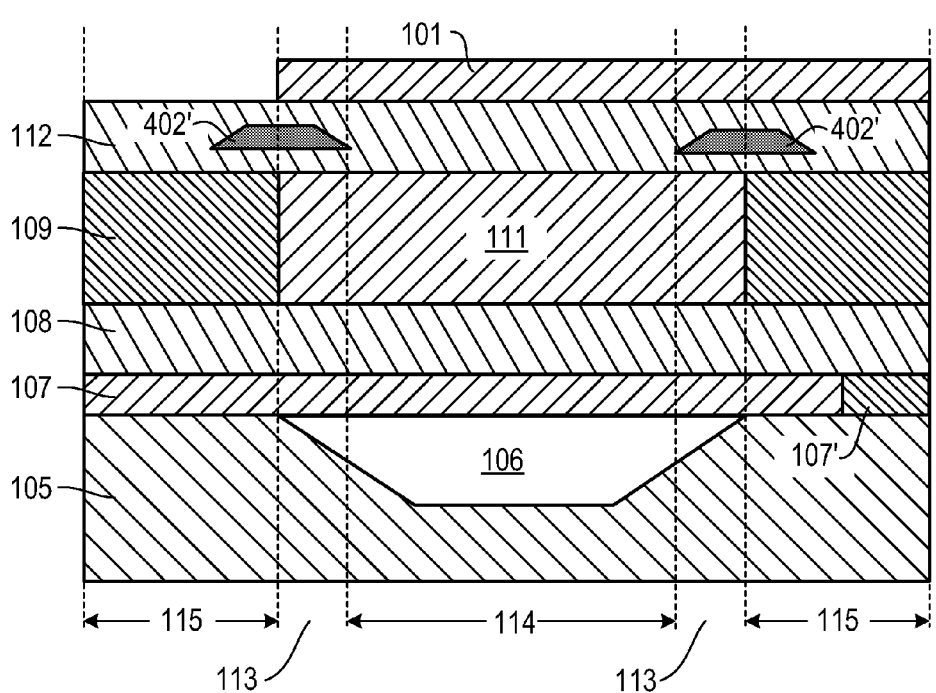

FIGS. 4A and 4B show cross-sectional views of a DBAR 400 in accordance with representative embodiments. The DBAR 400 comprises a plurality of layers disposed over a substrate 105 having a cavity 106. Many aspects of the DBAR 400 are common to those of DBAR 200, described above, and are not repeated in order to avoid obscuring the description of the representative embodiments presently described.

FIG. 4A shows a bridge 402 provided within the second piezoelectric layer 112. The bridge 402 is unfilled (i.e., contains air). Bridge 402 is disposed along the perimeter of the active region 114 of the DBAR 400, and fosters confinement of modes in the active region 114 of the DBAR 400. For purposes of illustration of the improvement in mode confinement in the active region 114 of the DBAR 400, bridge 402 having a width (x-dimension) of approximately 5.0 µm, a height of approximately 500 Å, and overlap 113 of the cavity 106 by approximately 2.0 µm was provided. An increase in Q-factor of approximately 100% (depending on frequency of operation, e.g., at parallel resonance frequency) may be expected compared to a known DBAR that does not include a bridge.

FIG. 4B shows a bridge 402' provided within the second piezoelectric layer 112. The bridge 402' is "filled" with a material (e.g., NEBSG or other material described above) to provide an acoustic impedance discontinuity. Bridge 402' is disposed along the perimeter of the active region 114 of the DBAR 400, and fosters confinement of modes in the active region 114 of the DBAR 400. For bridge 402' having the same width, height and overlap 113 of cavity 106 as bridge 402, similar improvements in Q-factor expected for bridge 402 are expected with the use of bridge 402'. Beneficially, the use of a filled bridge provides a more rugged structure.

Embodiments Comprising CRFs

FIGS. 5A-5D show cross-sectional views of CRF 500 in accordance with representative embodiments. It may be assumed for purposes of explanation that the top view of the CRF 500 is substantially the same as the top view of the FBAR 100, discussed above with reference to FIG. 1A. That is, the CRF 500 may include a top electrode 101 (referred to below as fourth electrode 101), comprising five (5) sides, with a connection side 102 configured to provide the electrical connection to an interconnect 103.

Figure 5A:
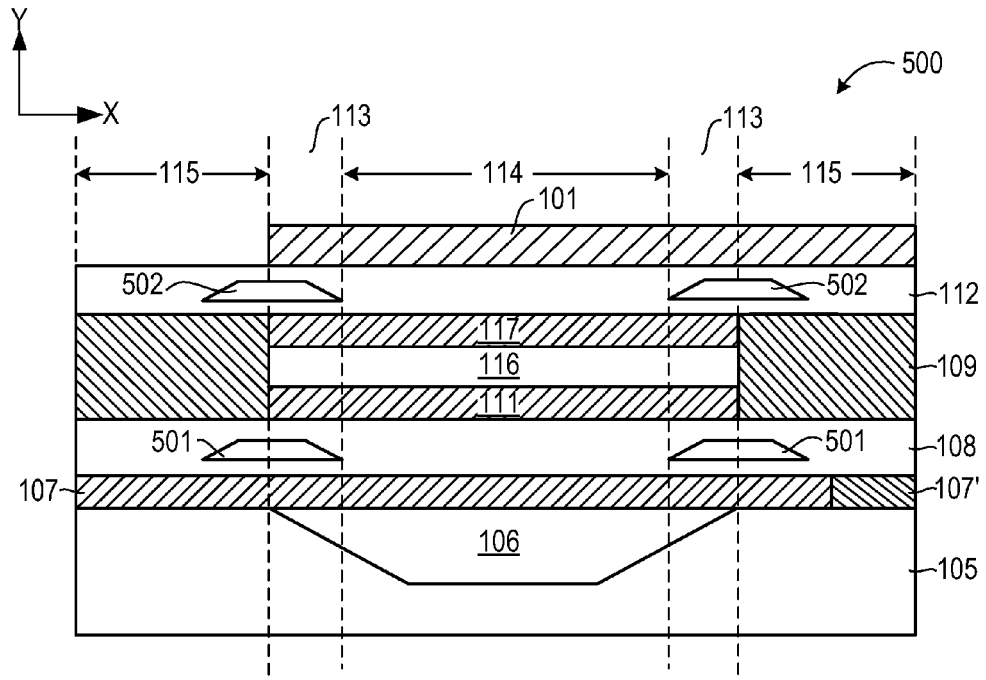
FIGS. 5A-5D are cross-sectional views of CRFs, each having bridges disposed within two piezoelectric layers of the CRF, in accordance with a representative embodiment.

Referring to FIG. 5A, the CRF 500 comprises a plurality of layers disposed over a substrate 105 having a cavity 106. The inclusion of a cavity 106 for reflection of acoustic waves in the CRF 500 is merely illustrative. It is emphasized that rather than cavity 106, a known acoustic reflector (e.g., a Bragg mirror (not shown)) comprising alternating layers of high and low acoustic impedance may be provided in the substrate 105 to provide acoustic isolation. The plurality of layers include first (first bottom) electrode 107, first piezoelectric layer 108, second (first top) electrode 111, coupling layer 116, third (second bottom) electrode 117, second piezoelectric layer 112, and fourth (second top) electrode 101, discussed below.

The first electrode 107 is disposed over the substrate 105 and partially over the cavity 106 (or Bragg mirror). A planarization layer 107' is provided over the substrate as shown. In a representative embodiment, the planarization layer 107' comprises NEBSG. The first piezoelectric layer 108 is disposed over the first electrode 107, and a first bridge 501 is included within the first piezoelectric layer 108, meaning that the first bridge 501 is surrounded by the piezoelectric material of the first piezoelectric layer 108, as discussed above with reference to bridge 104. The first bridge 501 is disposed along all sides (i.e., along the perimeter) of the CRF 500. The second electrode 111 and a planarization layer 109 are disposed over the first piezoelectric layer 108, where the planarization layer 109 generally does not overlap the cavity 106. In a representative embodiment, the planarization layer 109 comprises NEBSG. As should be appreciated by one of ordinary skill in the art, the structure provided by the first electrode 107, the first piezoelectric layer 108 and a second electrode 111 is a BAW resonator, which in this illustrative embodiment comprises a first BAW resonator of the CRF 500. When the BAW resonator is disposed over a cavity, it is a so-called FBAR; and when the BAW resonator is disposed over an acoustic reflector (e.g., Bragg mirror) it is a so-called SMR.

The acoustic coupling layer 116 ("coupling layer 116") is provided over the second electrode 111. In a representative embodiment, the coupling layer 116 may comprise carbon doped oxide (CDO) or NEBSG, such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht et al., filed on Feb. 23, 2010. The disclosure of this patent application is hereby incorporated by reference. Notably, CDO is a general class of comparatively low dielectric constant (low-k) dielectric materials, including carbon-doped silicon oxide (SiOCH) films, for example, of which the coupling layer 116 may be formed. Alternatively, the coupling layer 116 may comprise other dielectric materials with suitable acoustic impedance and acoustic attenuation, including, but not limited to porous silicon oxynitride (SiON), porous boron doped silicate glass (BSG), or porous phosphosilicate glass (PSG). Generally, the material used for the coupling layer 116 is selected to provide comparatively low acoustic impedance and loss in order to provide desired pass-band characteristics.

The third electrode 117 is provided over the coupling layer 116, and the second piezoelectric layer 112 is provided over the third electrode 117 and the planarization layer 109. A second bridge 502 is included within the second piezoelectric layer 112, meaning that the second bridge 502 is surrounded by the piezoelectric material of the second piezoelectric layer 112, as discussed above with reference to bridge 104. The fourth electrode 101 is provided over the second piezoelectric layer 112. The second bridge 502 is disposed along all sides (i.e., along the perimeter) of the CRF 500. As should be appreciated by one of ordinary skill in the art, the structure provided by the third electrode 117, the second piezoelectric layer 112 and the fourth electrode 101 is a BAW resonator, which in this illustrative embodiment comprises a second BAW resonator of the CRF 500. As mentioned above, when the BAW resonator is disposed over a cavity, it is a so-called FBAR; and when the BAW resonator is disposed over an acoustic reflector (e.g., Bragg mirror), it is a so-called SMR. The present teachings contemplate the use of either FBARs or SMRs to form CRFs. The CRFs are contemplated for a variety of uses, including filters.

Illustratively, the first electrode 107 and the fourth electrode 101 are formed of Mo having a thickness of approximately 1000 Å to approximately 20000 Å, and the second electrode 111 and the third electrode 117 are formed of W having a thickness of approximately 1000 Å to approximately 20000 Å. Other materials may be used for the first electrode 107, the second electrode 111, the third electrode 117 and the fourth electrode 101. Illustratively, the first piezoelectric layer 108 and the second piezoelectric layer 112 are formed of AlN having a thickness of approximately 5000 Å to approximately 15000 Å. Other materials may be used for the first piezoelectric layer 108 and the second piezoelectric layer 112, including but not limited to ZnO.

In representative embodiments, the configuration of the first and second bridges 501, 502 may be substantially the same as the bridge 104 discussed above with reference to FIG. 1B. Notably, the first bridge 501 and the second bridge 502 are not necessarily the same shape (e.g., one could have trapezoidal cross-sectional shape and one could have a rectangular cross-sectional in shape). For example, dimensions of the first and second bridges 501, 502 may be approximately 2.0 µm to approximately 10.0 µm in width (x-dimension in the coordinate system shown in FIG. 5A) and approximately 150 Å to approximately 3000 Å in height (y-dimension in the coordinate system shown in FIG. 2A).

Further, in certain embodiments, the first and second bridges 501, 502 extend over the cavity 106 by overlap 113. The overlap 113 (also referred to as the decoupling region) has a width (x-dimension) of approximately 0.0 µm (i.e., no overlap with the cavity 106) to approximately 10.0 µm. Notably, the first bridge 501 and the second bridge 502 do not need to be the same dimensions or located at the same relative position. For example, the overlap 113 of the first and second bridges 501, 502 with cavity 106 is shown in FIG. 5A to be identical; but this is not essential as different first and second bridges 501, 502 may overlap the cavity 106 to a greater or lesser extent than other bridges 501, 502.

Generally, the same considerations apply when designing bridges 501 and 502 for CRF 500 as described for bridge 104 for FBAR 100 in connection with FIGS. 1B and 1C. For example, the first and second bridges 501, 502 need to be wide enough to ensure suitable decay of evanescent waves at the boundary of a CRF region and a decoupling region in order to minimize tunneling of modes into the field region where propagating modes exist at the frequency of operation. On the other hand, if the first and second bridges 501, 502 are too wide, reliability issues can arise and can also limit the placement of similar CRFs (not shown) from being placed in proximity (thus unnecessary increasing the total area of a chip). As such, the optimum width of the first and second bridges 501, 502 may be determined experimentally.

In addition, the width and position of the first and second bridges 501, 502 and overlap 113 with the cavity 106 are selected to improve Q-enhancement of resonant mode. In general, the greater the overlap 113 of each of the first and second bridges 501, 502 with the cavity 106 of the CRF 500, the greater the improvement in odd-mode Q-factor)($Q_o$) and even mode Q-factor ($Q_e$) with the improvement realized being fairly small after an initial increase. The improvement in $Q_o$ and $Q_e$ must be weighed against a decrease in the electromechanical effective coupling coefficient $kt^2$, which decreases with increasing overlap 113 of the first and second bridges 501, 502 with the cavity 106. Degradation of the coupling coefficient $kt^2$ results in a degradation of insertion loss ($S_{21}$). As such, the overlap 113 of the first and second bridges 501, 502 with the cavity 106 may be optimized experimentally.

In order to form the first bridge 501, growth of the first piezoelectric layer 108 on the first electrode 107 is interrupted. Likewise, in order to form the second bridge 502, growth of the second piezoelectric layer 112 on the third electrode 117 is interrupted. In the depicted embodiment, the growth of the first and second piezoelectric layers 108, 112 were interrupted at about half way through the anticipated thickness, resulting in formation the first and second bridges 501, 502 in approximately the middle of the completed first and second piezoelectric layers 108, 112, respectively, as discussed above. However, the first and second bridges 501, 502 may be formed in different relative locations within the first and second piezoelectric layers 108, 112, without departing from the scope of the present teachings. Once the growth of the first piezoelectric layer 108 is interrupted, the first bridge 501 may be formed by patterning a sacrificial material over the grown portion of the first piezoelectric layer 108, and then continuing growth of the remaining portion of the first piezoelectric layer 108 thereover. Likewise, after formation of the third electrode 117 (on the coupling layer 116), the growth of the second piezoelectric layer 112 is interrupted, and the second bridge 502 may be formed by patterning a sacrificial material over the grown portion of the second piezoelectric layer 112. Growth of the remaining portion of the second piezoelectric layer 112 is then continued thereover. After the other layers of the CRF 500 are formed as desired (e.g., the fourth electrode 101), the sacrificial material is released leaving the first and second bridges 501, 502 "unfilled." In a representative embodiment, the sacrificial material used to form the first and second bridges 501, 502 is the same as the sacrificial material used to form the cavity 106, such as PSG, for example.

In a representative embodiment, the first bridge 501 and the second bridge 502 define a perimeter along the active region 114 of the CRF 500. The active region 114 thus includes the portions of the first BAW resonator and the second BAW resonator disposed over the cavity 106 and bounded by the perimeter provided by the first bridge 501 and the second bridge 502. As should be appreciated by one of ordinary skill in the art, the active region of the CRF 500 is bordered around its perimeter by an acoustic impedance discontinuity created at least in part by the first and second bridges 501, 502, and above and below (cavity 106) by an acoustic impedance discontinuity due to the presence of air. Thus, a resonant cavity is beneficially provided in the active region of the CRF 500. In certain embodiments, the first bridge 501 and the second bridge 502 are unfilled (i.e., contain air), as is the cavity 106. In other embodiments described more fully below, the first bridge 501, or the second bridge 502, or both, are filled with a material to provide the desired acoustic impedance discontinuity.

It is noted that the first bridge 501, or the second bridge 502, or both, do not necessarily have to extend along all edges of the CRF 500, and therefore not along the perimeter of the DBAR 500. For example, the first bridge 501 or the second bridge 502, or both, may be provided on four "sides" of a five-sided CRF 500 (similar to the five-sided FBAR 100 shown in FIG. 1A). In certain embodiments, the first bridge 501 is disposed along the same four sides of the CRF 500 as the second bridge 502. In other embodiments, the first bridge 501 is disposed along four sides (e.g., all sides but the connection side 102) of the CRF 500 and the second bridge 502 is disposed along four sides of the CRF 500, but not the same four sides as the first bridge 501 (e.g., second bridge 502 is disposed along the connection side 102).

The acoustic impedance mismatch provided by the first bridge 501 and the second bridge 502 causes reflection of acoustic waves at the boundary that may otherwise propagate out of the active region and be lost, resulting in energy loss. The first bridge 501 and the second bridge 502 serve to confine the modes of interest within the active region of the CRF 500 and reduce energy losses in the CRF 500. Reducing such losses serves to increase the Q-factor of the modes ($Q_o$ and $Q_e$) of interest in the CRF 500, and to improve insertion loss ($S_{21}$) over the passband of the CRF 500.

Figure 5B:
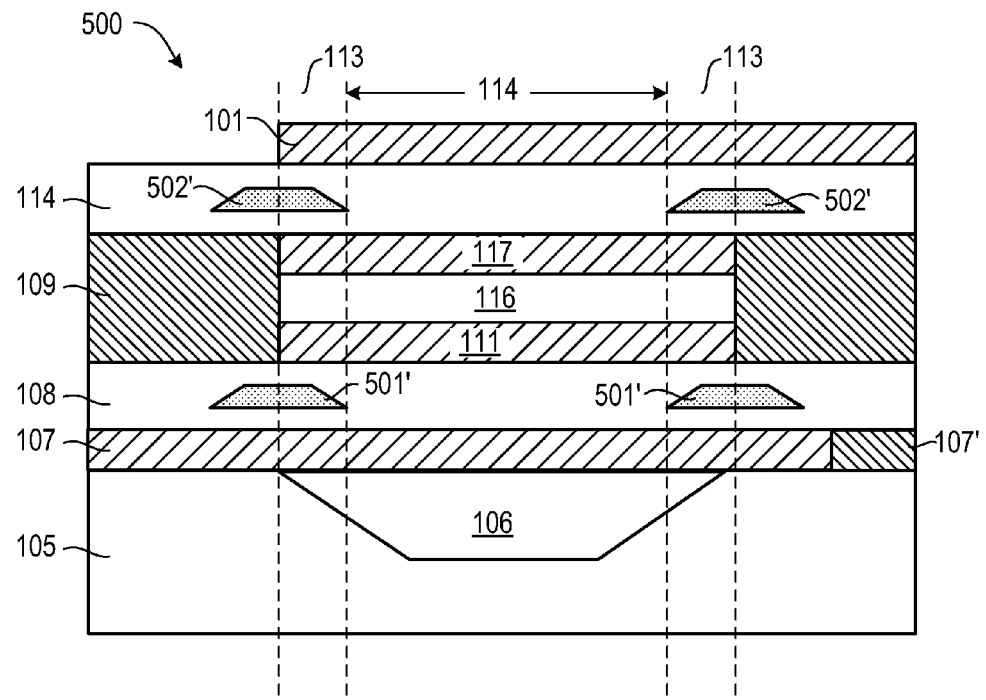

In the representative embodiment shown and described in connection with FIG. 5A, the first and second bridges 501, 502 are unfilled (i.e., contain air as the acoustic medium). FIG. 5B shows a cross-sectional view of CRF 500 in which both bridges, indicated as first bridge 501' and second bridge 502', are filled with a material to provide the acoustic impedance discontinuity to reduce losses. In certain embodiments, first bridge 501' and second bridge 502' are filled with NEBSG, CDO, SiC or other suitable dielectric material that will not release when the sacrificial material disposed in the cavity 106 is released. In other embodiments, the first bridge 501' and the second bridge 502' are filled with one of tungsten (W), molybdenum (Mo), copper (Cu), iridium (Ir) or other suitable metal materials that will not release when the sacrificial material disposed in the cavity 106 is released. The first and second bridges 501', 502' are fabricated by forming the NEBSG or other fill material within the first piezoelectric layer 108 and the second piezoelectric layer 112, respectively, by interrupting growth of the first and second piezoelectric layers 108, 112, as discussed above, and forming respective layers of the CRF 500 thereover. When the cavity 106 is formed through the release of the sacrificial, the first bridge 501' and the second bridge 502' remain "filled" with the selected, non-etchable material.

Figure 5C:
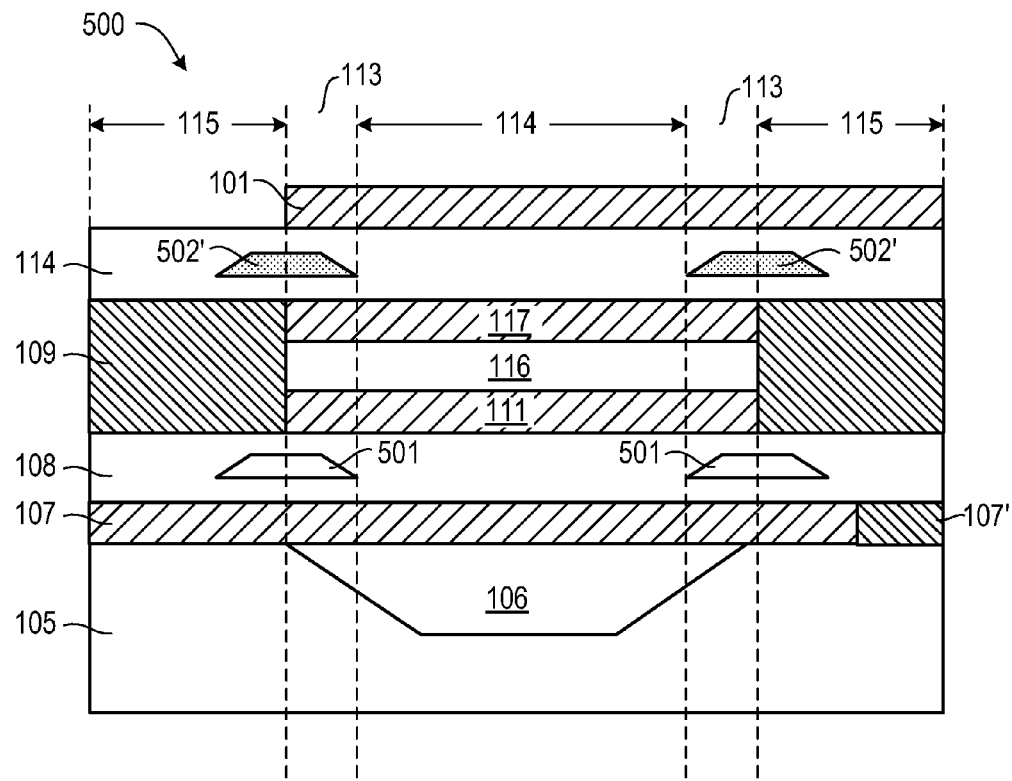

FIG. 5C shows a cross-sectional view of CRF 500 in which the second bridge 502' is filled with a material to provide the acoustic impedance discontinuity to reduce losses, and the first bridge 501 is filled with air. This modification of the CRF 500 is fabricated by patterning a material (e.g., NEBSG) within the second piezoelectric layer 112 that will not release before forming the fourth electrode 101. The first bridge 501 is formed by patterning a sacrificial material within the first piezoelectric layer 108, and releasing the sacrificial material as described above.

Figure 5D:
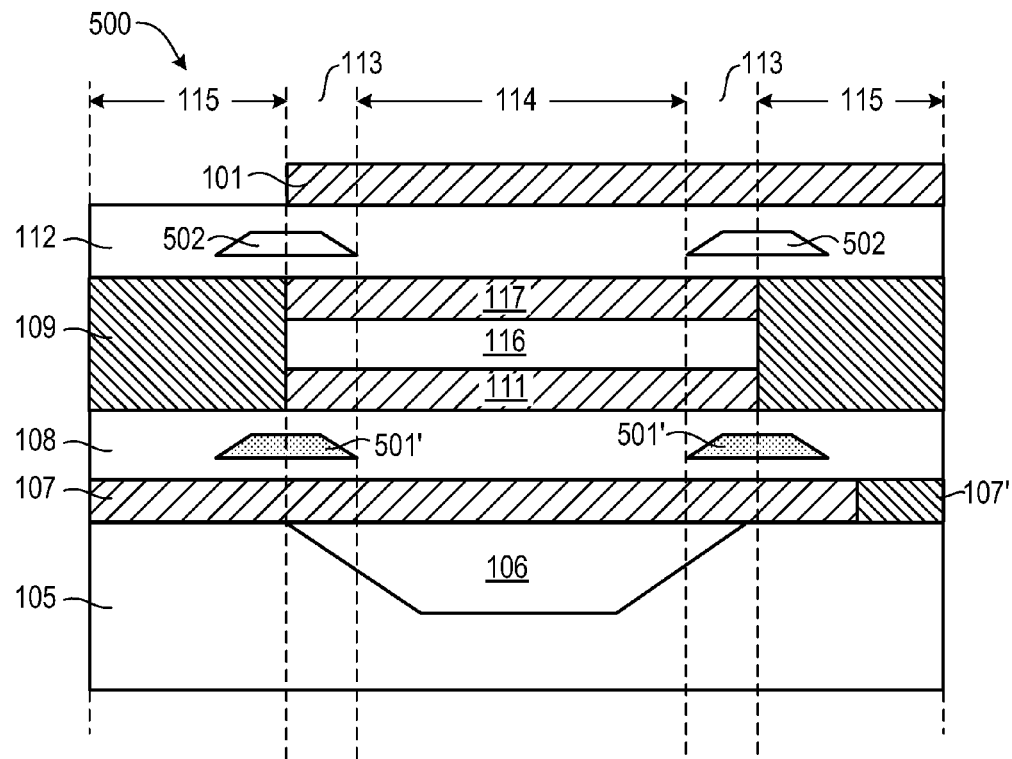

FIG. 5D shows a cross-sectional view of CRF 500 in which the second bridge 502 is filled with air, and the first bridge 501' is filled with a material to provide the acoustic impedance discontinuity to reduce losses. This modification of the CRF 500 is fabricated by patterning a material (e.g., NEBSG) within the first piezoelectric layer 108 that will not release before forming the second electrode 111. The second bridge 502 is formed by patterning a sacrificial material within the second piezoelectric layer 112, and releasing the sacrificial material as described above.

In the embodiments described presently, a single bridge is provided in an illustrative CRF. The single bridge is provided within a single piezoelectric layer in each embodiment, and is disposed about a perimeter that encloses the active region of the CRF. By placing the bridge within different piezoelectric layers, the various embodiments can be studied to test the degree of coupling of modes in the active (CRF) region and the modes in the field plate region. Generally, the bridge decouples modes with a comparatively large propagation constant ($k_p$) from the modes in the field plate region. As described below, certain embodiments comprise an "unfilled" bridge and certain embodiments comprise a "filled" bridge. Many details of the present embodiments are common to those described above in connection with the representative embodiments of FIGS. 1A-1C and 5A-5D.

Figure 6A:
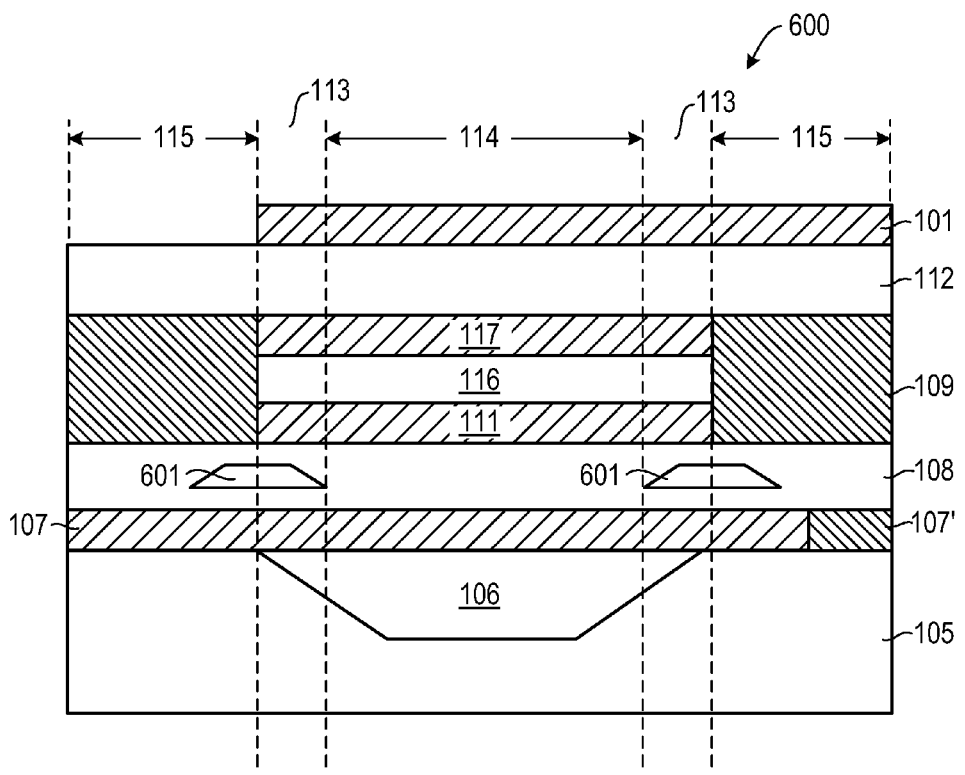
FIGS. 6A-6B are cross-sectional views of CRFs, each having a bridge disposed within a piezoelectric layer of the CRF, in accordance with a representative embodiment.
Figure 6B:
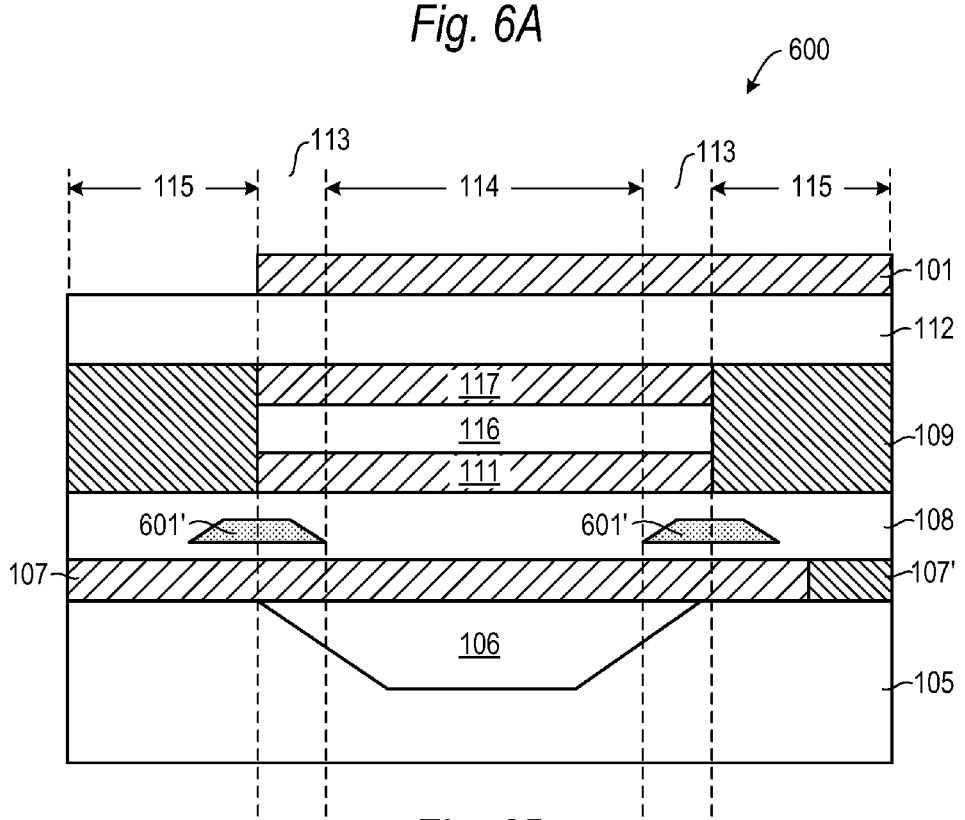

FIGS. 6A and 6B show cross-sectional views of a CRF 600 in accordance with representative embodiments. The CRF 600 comprises a plurality of layers disposed over a substrate 105 having a cavity 106. Many aspects of the CRF 600 are common to those of CRF 500, described above, and are not repeated in order to avoid obscuring the description of the representative embodiments presently described.

FIG. 6A shows a bridge 601 provided within the first piezoelectric layer 108. The bridge 601 is unfilled (i.e., contains air). The bridge 601 is disposed around the perimeter of the active region 114 of the CRF 600, and fosters confinement of modes in the active region 114 of the CRF 600. Similarly to FBAR 100 discussed above, such increased mode confinement in CRF 600 is expected to improve insertion loss and even and odd mode quality factors as compared to a known CRF (without a bridge).

FIG. 6B shows a bridge 601' provided within the first piezoelectric layer 108 of CRF 600. The bridge 601' is "filled" with a material (e.g., NEBSG or other material described above) to provide an acoustic impedance discontinuity. Bridge 601' is disposed around the perimeter of the active region 114 of the CRF 600. Beneficially, the use of a filled bridge provides a more rugged structure.

Figure 7A:
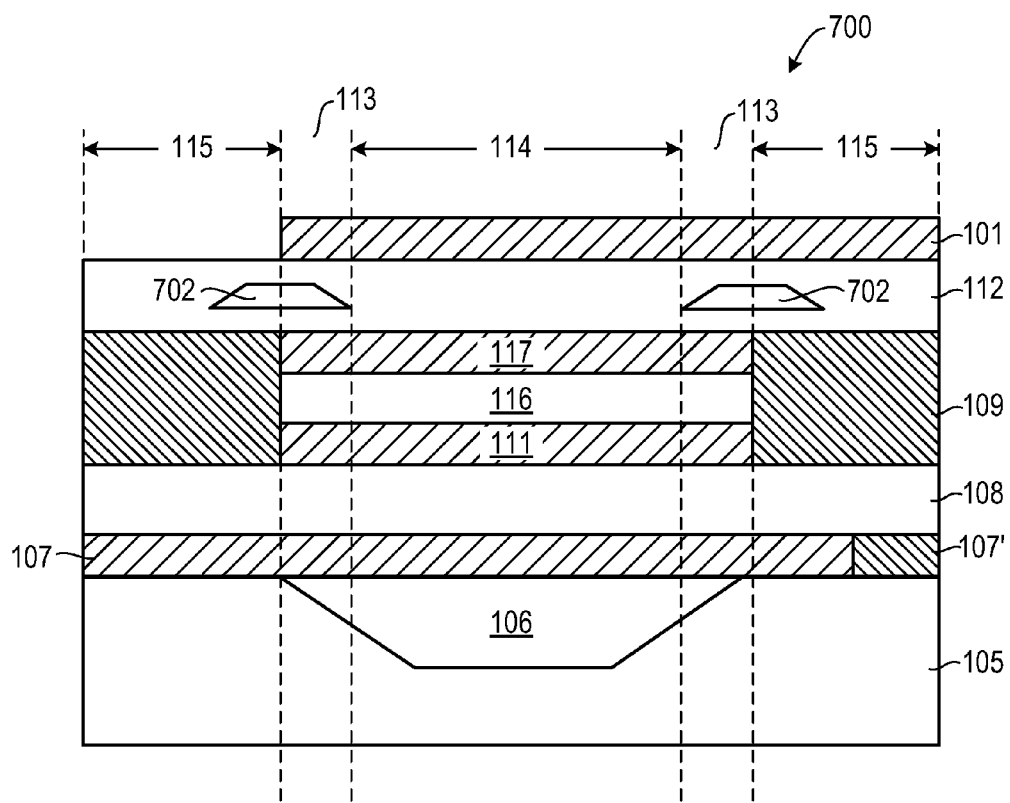
FIGS. 7A-7B are cross-sectional views of CRFs, each having a bridge disposed within another piezoelectric layer of the CRF, in accordance with a representative embodiment.
Figure 7B:
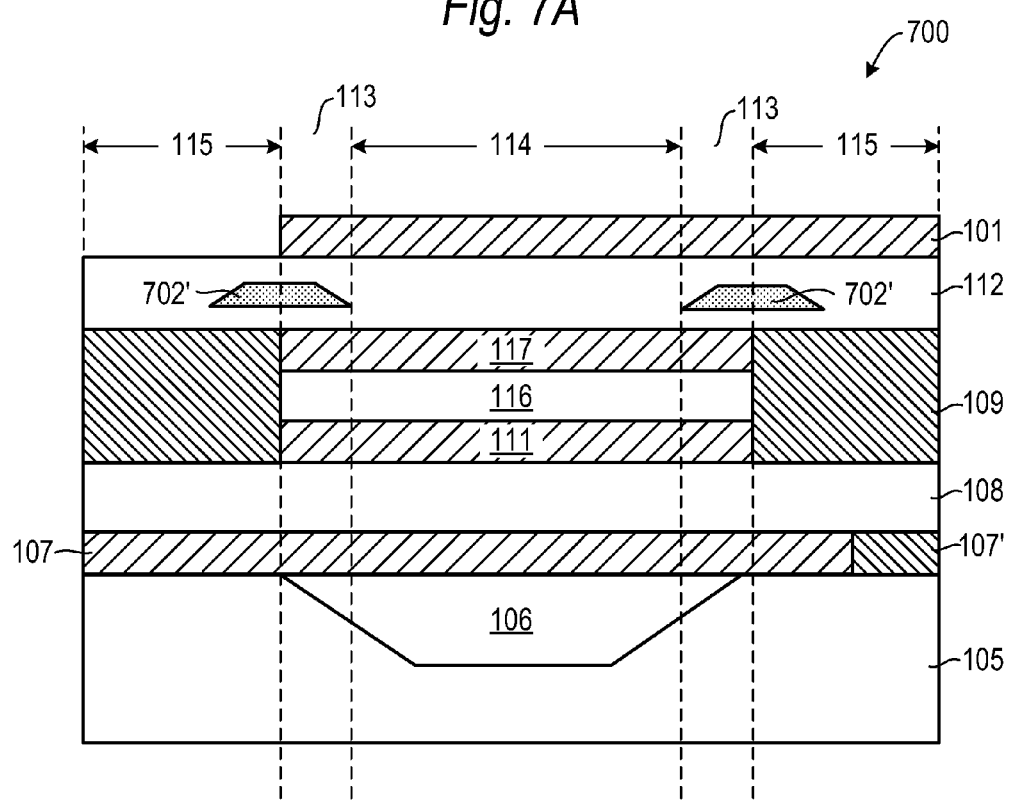

FIGS. 7A and 7B show cross-sectional views of a CRF 700 in accordance with representative embodiments. The CRF 700 comprises a plurality of layers disposed over a substrate 105 having a cavity 106. Many aspects of the CRF 700 are common to those of CRF 500, described above, and are not repeated in order to avoid obscuring the description of the representative embodiments presently described.

FIG. 7A shows a bridge 702 provided within the second piezoelectric layer 112. The bridge 702 is unfilled (i.e., contains air). The bridge 702 is disposed along the perimeter of the active region 114 of the DBAR 400, and fosters confinement of modes in the active region 114 of the CRF 700. Similarly to FBAR 100 discussed above, such increased mode confinement in CRF 700 is expected to improve insertion loss and even and odd mode quality factors as compared to a known CRF (without a bridge).

FIG. 7B shows a bridge 702' provided within the second piezoelectric layer 112. The bridge 702' is "filled" with a material (e.g., NEBSG or other material described above) to provide an acoustic impedance discontinuity. The bridge 702' is disposed along the perimeter of the active region 114 of the CRF 700, and fosters confinement of modes in the active region 114 of the CRF 700. Beneficially, the use of a filled bridge provides a more rugged structure.

Notably, each of the FBARs 100, DBARs 200-400 and CRFs 500-700 may include various additional features without departing from the scope of the present teachings. For example, an inner raised region and/or an outer raised region may be included on a top surface of the top electrode (e.g., second electrode 101 in FIGS. 1A-1C; third electrode 101 in FIGS. 2A-4B; fourth electrode 101 in FIGS. 5A-7B) in the active region 114. The inner raised region may be separated from the edges of the active region or from an inner edge of the outer raised region by a gap. Details of such inner and outer raised regions, including illustrative thickness and width dimensions of the inner and outer raised regions, as well as widths of corresponding gaps, are described in commonly owned U.S. patent application Ser. No. 13/074,094, to Shirakawa et al., entitled "Stacked Bulk Acoustic Resonator and Method of Fabricating Same," filed on Mar. 29, 2011, the disclosure of which is hereby incorporated by reference. The combination of the bridges, the inner raised region and/or the outer raised regions further improves mode confinement in the active region (e.g., active region 114) of the representative FBARs 100, DBARs 200-400 and CRFs 500-700.

In accordance with illustrative embodiments, BAW resonator structures comprising bridges and their methods of fabrication are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
   a first electrode disposed over a substrate;
   a piezoelectric layer disposed over the first electrode;
   a second electrode disposed over the piezoelectric layer; and
   a bridge buried within the piezoelectric layer, wherein the bridge defines at least a portion of a perimeter along an active region of the BAW resonator structure.

2. The BAW resonator structure of claim 1, wherein the bridge comprises an unfilled bridge, containing air.

3. The BAW resonator structure of claim 1, wherein the bridge comprises a filled bridge, containing a dielectric material.

4. The BAW resonator structure of claim 3, wherein the dielectric material comprises one of non-etchable borosilicate glass (NEBSG), carbon doped silicon dioxide (CDO), or silicon carbide (SiC).

5. The BAW resonator structure of claim 1, wherein the bridge comprises a filled bridge, containing a metal.

6. The BAW resonator structure of claim 5, wherein the metal comprises one of tungsten (W), molybdenum (Mo), copper (Cu) or iridium (Ir).

7. The BAW resonator structure of claim 1, wherein the bridge has a trapezoidal cross-sectional shape.

8. A bulk acoustic wave (BAW) resonator structure, comprising:
   a first electrode disposed over a substrate;
   a first piezoelectric layer disposed over the first electrode;
   a second electrode disposed over the first piezoelectric layer;
   a second piezoelectric layer disposed over the second electrode;
   a third electrode disposed over the second piezoelectric layer; and
   a first bridge buried within one of the first piezoelectric layer and the second piezoelectric layer.

9. The BAW resonator structure of claim 8, wherein the first bridge comprises an unfilled bridge, containing air.

10. The BAW resonator structure of claim 8, further comprising:
    a second bridge buried within the other one of the first piezoelectric layer and the second piezoelectric layer.

11. The BAW resonator structure of claim 10, wherein at least one of the first bridge and the second bridge comprises an unfilled bridge, containing air.

12. The BAW resonator structure of claim 10, wherein at least one of the first bridge and the second bridge comprises a filled bridge, containing a fill material having an acoustic impedance.

13. The BAW resonator structure of claim 12, wherein the fill material comprises one of dielectric material or a metal.

14. A bulk acoustic wave (BAW) resonator structure, comprising:
    a first BAW resonator comprising a first electrode, a first piezoelectric layer disposed over the first electrode, and a second electrode disposed over the first piezoelectric layer;
    an acoustic coupling layer disposed over the second electrode of the first BAW resonator, wherein the acoustic coupling layer is configured to determine pass-band characteristics of the BAW resonator structure;
    a second BAW resonator comprising a third electrode disposed over the acoustic coupling layer, a second piezoelectric layer disposed over the third electrode, and a fourth electrode disposed over the second piezoelectric layer; and
    a first bridge buried within one of the first piezoelectric layer of the first BAW resonator and the second piezoelectric layer of the second BAW resonator.

15. The BAW resonator structure of claim 14, wherein the first bridge comprises an unfilled bridge, containing air.

16. The BAW resonator structure of claim 14, further comprising:
    a second bridge buried within the other one of the first piezoelectric layer of the first BAW resonator and the second piezoelectric layer of the second BAW resonator.

17. The BAW resonator structure of claim 16, wherein at least one of the first bridge and the second bridge comprises an unfilled bridge, containing air.

18. The BAW resonator structure of claim 17, wherein at least one of the first bridge and the second bridge comprises a filled bridge, containing a fill material having an acoustic impedance.

19. The BAW resonator structure of claim 18, wherein the fill material comprises one of dielectric material or a metal.

20. The BAW resonator structure of claim 17, wherein the acoustic coupling layer comprises at least one of carbon doped oxide (CDO) and NEBSG.

* * * * *